United States Patent
Degner et al.

(10) Patent No.: US 12,016,123 B2
(45) Date of Patent: Jun. 18, 2024

(54) HIGH-CAPACITY COMPUTER MODULES

(71) Applicant: Apple Inc., Cupertino, CA (US)

(72) Inventors: Brett W. Degner, Menlo Park, CA (US); Michael E. Leclerc, Sunnyvale, CA (US); Eric R. Prather, Santa Clara, CA (US); Scott J. Campbell, Sunnyvale, CA (US); James M. Cuseo, Cupertino, CA (US); Rodrigo Dutervil Mubarak, San Jose, CA (US); Ian A. Guy, Santa Cruz, CA (US); Daniel D. Hershey, Los Gatos, CA (US); Mariel L. Lanas, Palo Alto, CA (US); Michael D. McBroom, Celeste, TX (US); David C. Parell, Palo Alto, CA (US); Bartley K. Andre, Palo Alto, CA (US); Danny L. McBroom, Leander, TX (US); Houtan R. Farahani, San Ramon, CA (US)

(73) Assignee: Apple Inc., Cupertino, CA (US)

( * ) Notice: Subject to any disclaimer, the term of this patent is extended or adjusted under 35 U.S.C. 154(b) by 435 days.

(21) Appl. No.: 16/889,041

(22) Filed: Jun. 1, 2020

(65) Prior Publication Data
US 2020/0383206 A1    Dec. 3, 2020

Related U.S. Application Data

(60) Provisional application No. 62/855,879, filed on May 31, 2019.

(51) Int. Cl.
*H05K 1/14*    (2006.01)
*H05K 5/02*    (2006.01)
(Continued)

(52) U.S. Cl.
CPC ........... *H05K 1/141* (2013.01); *H05K 5/0273* (2013.01); *H05K 5/0295* (2013.01);
(Continued)

(58) Field of Classification Search
CPC ....... G06F 1/186; G06F 1/185; H01R 12/721; H05K 1/141; H05K 5/026; H05K 5/0282; H05K 5/0273
See application file for complete search history.

(56) References Cited

U.S. PATENT DOCUMENTS 5,440,755 A * 8/1995 Harwer .................... H05K 1/14
                                                          710/105
7,443,696 B2 * 10/2008 Lin .......................... G06F 1/185
                                                          361/803
(Continued)

FOREIGN PATENT DOCUMENTS

CN    103261996 A    8/2013
CN    108628403 A    10/2018
(Continued)

OTHER PUBLICATIONS

BB-ITX96 V2 Blade Computing System for Mini-ITX, Product Data Sheet, [online], retrieved from the Internet, [retrieved on Jun. 5, 2020], <URL: http://www.buildablade.com/bb-itx96.htm>, 3 pages.
(Continued)

*Primary Examiner* — James Wu
(74) *Attorney, Agent, or Firm* — Kilpatrick Townsend & Stockton LLP

(57) ABSTRACT

Computer modules that can have a high-capacity, can simplify the design of a computer system housing the modules, can utilize system resources in a highly configurable manner, can provide a variety of functionality, and can be readily inserted into, and removed from, a computer system.

20 Claims, 31 Drawing Sheets

(51) Int. Cl.
  *H05K 7/14* (2006.01)
  *H05K 7/20* (2006.01)
(52) U.S. Cl.
  CPC ......... *H05K 7/1405* (2013.01); *H05K 7/1409* (2013.01); *H05K 7/20163* (2013.01); *H05K 7/20172* (2013.01); *H05K 7/20209* (2013.01)

(56) References Cited

U.S. PATENT DOCUMENTS

| | | | |
|---|---|---|---|
| 8,295,040 B2 | 10/2012 | Knopf et al. | |
| 9,436,234 B1* | 9/2016 | Felton | H05K 7/1445 |
| 11,546,992 B2* | 1/2023 | Hill | H05K 3/36 |
| 2006/0039120 A1* | 2/2006 | Young | G06F 1/186 |
| | | | 361/719 |

FOREIGN PATENT DOCUMENTS

| | | |
|---|---|---|
| JP | 2004-514962 A | 5/2004 |
| KR | 10-0161154 B1 | 1/1999 |
| KR | 10-2003-0016074 A | 2/2003 |
| KR | 10-2004-0080887 A | 9/2004 |

OTHER PUBLICATIONS

Office Action (English translation) dated Aug. 24, 2022 in Korean Patent Application No. 10-2020-0065309, 4 pages.
Chinese Patent Application No. 202010477333.9 , "Office Action", Feb. 8, 2024, 7 pages.

\* cited by examiner

HIGH-CAPACITY COMPUTER MODULES

CROSS-REFERENCE TO RELATED APPLICATIONS

This application claims the benefit of, and is a nonprovisional of, U.S. provisional application No. 62/855,879, filed May 31, 2019, which is incorporated by reference.

BACKGROUND

Computer systems, such as desktop computers, servers, and other systems can include a main-logic board that can support processing and other computer functions. These computer systems can also be at least somewhat configurable. For example, they can optionally include computer expansion cards and other types of computer modules that can provide additional functionality. These computer modules can include graphics processing modules that can be used for graphics or other data processing functions, networking modules, sound modules, data storage modules, and other types of modules. They can be compatible with a standard, such as Peripheral Component Interconnect Express (PCIe), Peripheral Component Interconnect eXtended (PCI-X), Accelerated Graphics Port (AGP), or other standard. But these modules can be limited in their capacity. Their capabilities can fall short in very demanding applications. Accordingly, it can be desirable to provide computer modules that have a high capacity or are highly capable.

These computer modules can require resources from the computer system. The computer system can use these resources to provide an environment in which the computer modules can properly operate. These resources can be used for power, cooling, to provide interfaces with other circuits inside and outside of the computer system, and for other reasons. Also, these modules might not need to use all the resources that can be available to them, or they can need additional resources. Accordingly, it can be desirable that these computer modules have a reduced reliance on computer system resources. It can also be desirable that they be able to use these resources in a highly configurable manner.

These modules can be somewhat difficult to insert and remove. Space can be limited, particularly when multiple other cards are installed. Accordingly, it can be desirable that these cards be readily inserted into, and removed from, a computer system.

Thus, what is needed are computer modules that can have a high-capacity, can simplify the design of a computer system housing the modules, can utilize system resources in a highly configurable manner, can provide a variety of functionality, and can be readily inserted into, and removed from, a computer system.

SUMMARY

Accordingly, embodiments of the present invention can provide computer modules that can have a high-capacity, can simplify the design of a computer system housing the modules, can utilize system resources in a highly configurable manner, can provide a variety of functionality, and can be readily inserted into, and removed from, a computer system.

These and other embodiments of the present invention can provide computer modules having a high capacity. This high capacity can be achieved through the use of nonstandard sized modules. For example, these high-capacity modules can be sized larger than a standard size. A module can be wider than standard, using two, three, four, or more than four slots in a computer system enclosure. A module can be longer, taller, or both longer and taller than standard module and arranged to fit in a nonstandard enclosure. For example, the module can be 20 percent, 25 percent, 30 percent, or other percentage taller than a standard module, such as a PCI-type or other standard. These increased dimensions can provide additional space or board area for an increase in capacity or capability.

These and other embodiments of the present invention can provide computer modules having a high capacity by including additional data paths. For example, an extra card edge can be included on a board of a module (a module board), where the extra card edge can include contacts for additional data lines. These data lines can route signals between the high-capacity modules and circuitry in the computer system housing the modules, such as a system master controller. For example, these extra data lines can include additional PCIe lanes. They can also include DisplayPort lanes in order to provide DisplayPort data to the system mater controller.

The additional card edge can be a separate card edge on the same side of a module board as another card edge, the additional card edge can be on another side of the module board, or the additional card edge can be an extension of the other card edge. For example, a module board can have two card edges along a same side (or different sides), where a first card edge can be a PCI-type or other standard card edge and a second card edge can be a proprietary or nonstandard edge that is not a PCI-type of other standard card edge. The PCI-type card edge can have a shape and pinout that conforms to an applicable standard, such as the PCI, PCIe, PCI-X, or other standard, including ISA, AGP, and others that are currently being used, being developed, or will be developed in the future (referred to collectively as a standard, or PCI-type or PCIe-type standard.) The proprietary card edge can have a different shape and pinout as a PCI-type card edge, or it can have the same or similar shape or pinout. These two card edges can be inserted into sockets on a main-logic board or elsewhere in the computer system, where the sockets are formed as two separate sockets or where the sockets are integrally formed as a single socket. These and other embodiments of the present invention can provide computer modules having module boards with three or more card edges. These three or more card edges can be along a same or different sides of the module board. Each of the three card edges can be a PCI-type or other standard card edge or a proprietary or nonstandard edge that is not a PCI-type of other standard card edge. These three or more card edges can be inserted into sockets on a main-logic board or elsewhere in the computer system. The three or more sockets can be separate sockets, they can be formed as two sockets, or they can be integrally formed as a single socket.

These and other embodiments of the present invention can provide computer modules that include more than one module board. For example, a computer module that is larger than a conventional module can utilize the additional space by including additional boards, circuits, heat sinks, or other structures or components. Two or more such module boards can be included and they can each have different card edges, though card edges can be omitted on one or more of these additional cards. For example, a first module board can have a PCI-type card edge, while a second module board can have a nonstandard card edge. A first module board can have two card edges along a same side, or different sides, where one edge can be a PCI-type or other standard card edge and a second card edge can be a proprietary or nonstandard edge, while a second module board can have a PCI-type or other standard card edge. A first module board can have two card edges along a same side, or different sides, where one edge can be a PCI-type or other standard card edge and a second card edge can be a proprietary or nonstandard edge, while a second module board can have a nonstandard card edge. A first module board can have two card edges along a same side, or different sides, where one edge can be a PCI-type or other standard card edge and a second card edge can be a proprietary or nonstandard edge, while a second module board can have two card edges along a same side, or different sides, where one edge can be a PCI-type or other standard card edge and a second card edge can be a proprietary or nonstandard edge. A first module board can have two card edges along a same side, or different sides, where one edge can be a PCI-type or other standard card edge and a second card edge can be a proprietary or nonstandard edge, while a second module board might not include a card edge. A computer module can further have three or more than three of these boards. These module boards can be isolated from each other, or they can share electrical resources, physical resources, or both, such as an enclosure, data, power, a heat sink, or other resource. The modules can include a bridge or other pathway for data, and possibly power, to be shared among circuits on two or more module boards. These card edges can be inserted into corresponding sockets in a computer system enclosure, though in some embodiments of the present invention, one or more such card edges might not be inserted into a corresponding socket in some circumstances. In another example, a computer module can include a first module board having a first card edge and a second module board with no card edges. A data bus can be coupled to transfer data between the first module board and the second module board. A heat sink can be shared between the first board and the second board. For example, a heat sink can be physically placed between the first board and the second board. The first board can optionally have a second card edge, where either or both the first card edge and the second card edge can be a standard card edge or a nonstandard card edge.

These and other embodiments of the present invention can simplify the design of a computer system housing these high-capacity computer modules. For example, the extra edge that can be included on a module board can support large-sized power contacts that can be sufficient to provide power to a high-capacity module. This can simplify the computer system's design by reducing or eliminating the need for an additional cable and connector to deliver power to the module. Also, by including an extra card edge, or by extending a card edge to covey additional data paths, the need for an additional data cable and connector can be obviated.

These and other embodiments of the present invention can simplify the design of these high-capacity computer modules by utilizing one or more fans at a front or other side of a computer system enclosure. For example, one, two, three, or more than three fans can be located at a front (or another side) of a computer system enclosure. These fans can move air along a length of a high-capacity computer module and out the back (or another side) of the computer system enclosure. By not including fans in the high-capacity computer module, the computer modules themselves can be simplified. Also, by not including fans in the computer modules, recirculation of hot air in the computer modules can be avoided. For example, the computer modules can include fins and other structures to act as ducts in order to guide airflow and avoid recirculation. A number of fans that can be sufficient to cool a first number of high-capacity and standard computer modules can be included. Where less than the first number of high-capacity and standard computer modules are included, one or more of the fans can be powered down or run at a slower speed. Since these fans are not included in the high-capacity computer modules themselves, they can be larger in size and can therefore generate less noise by operating at a lower speed.

These and other embodiments of the present invention can provide computers that include computer modules and computer systems that work together to provide cooling for the computer modules. For example, a computer module can communicate one or more parameters or other information to a system controller or other circuit in a computer system housing the computer module, for example in a computer system enclosure. These parameters or other information can be provided from the computer module to the system controller using a socket in which a board of the computer module is mounted, it can be provided wirelessly, or it can be provided in another way. At least partially in response to these one or more parameters or other information, the system controller can adjust a speed of one or more fans in an enclosure of the computer system. These parameters can include a temperature of a computer module or one or more components in the computer module, the power being dissipated by the computer module, a maximum allowable temperature of one or more components of the computer module, or other parameter or information. For example, a computer module can send a maximum allowable temperature of one or more components along with a present temperature of the module to a system controller in a computer system. The system controller in the computer system can then adjust the fan speed in the computer system enclosure to ensure that the maximum temperature is not exceeded.

In these and other embodiments of the present invention, other parameters or other information can be provided from a computer module to a system controller or other circuit in a computer system (referred to here as simply a computer system.) For example, a computer module can provide an expected cooling profile to the computer system, where the expected cooling profile informs the computer system to expect a certain temperature for the computer module given a certain fan speed profile. Also, parameters or other information that identify the type of computer module can be provided by the computer module to the computer system. This can be used by the computer system to adjust a speed of one or more fans in the computer system enclosure. For example, a computer module housing several hard-disk drives might need to operate at a different temperature than a computer module housing a graphics processing unit.

In these and other embodiments of the present invention, other parameters or other information can be provided from a system controller of a computer system to a computer module. These parameters or other information can be provided from the system controller in the computer system to the computer module using a socket in which a board of the computer module is mounted, it can be provided wirelessly, or it can be provided in another way. For example, a computer system can inform a computer module that all fans are operating at full speed. This can in turn cause the computer module to reduce functionality, lower clock rates, or take other action to control or reduce its temperature. Similarly, a computer system can inform a computer module that one or more fans are inoperative, or that it is presently undesirable to increase fan speed. Mitigation steps can then be taken by the computer module to adjust its power as needed.

The speeds of the one or more fans in the computer system enclosure can also be adjusted as a group to avoid vibration or acoustic artifacts. For example, instead of having two or more fans running at the same speed, their speeds can be offset by an amount to avoid the constructive interference that could otherwise generate or increase noise. For similar reasons, two or more fans can be controlled to not spin at frequencies that are harmonics or multiples of each other, or that have other relationships.

These and other embodiments of the present invention can utilize system resources in a highly configurable manner. Again, a wide high-capacity module can have two card edges on a module board, where a first card edge can be a standard edge, such as a PCI-type card edge, and a second additional edge can be nonstandard. These two card edges can be inserted into sockets of a main-logic board. The high-capacity computer module can be wide enough to overlap and block an adjacent card edge socket. Ordinarily, this could waste the functionality of the blocked socket and associated circuitry. Instead, these and other embodiments of the present invention can include multiplexers on the main-logic board that can reroute signals from the unused, overlapped socket (or portion of the socket) to the socket for the additional card edge.

These and other embodiments of the present invention can provide high-capacity computer modules that provide a variety of functionality. For example, a larger form factor for a high-capacity computer module can allow a module to contain an increased number of hard-disk drives, solid-state drives, or other memory modules. A battery bank forming an uninterruptable power supply can be arranged as a high-capacity computer module to take advantage of the larger size.

These and other embodiments of the present invention can provide high-capacity computer modules that can be readily inserted into, and removed from, a computer system. For example, a high-capacity computer module can include a strong front grill portion or enclosure wall and one or more rear tabs to help a user insert the module into a computer system. The front grill portion or enclosure wall can include front tabs that can fit in slots in a rear opening of a computer system enclosure. To prevent a computer module from being inserted into an incompatible location in a computer system enclosure, one or more slots in the rear opening can be made larger. These larger slots can be formed to accept a larger front tab on the enclosure wall, where the larger front tab does not fit in the remaining slots. The rear tabs can fit in slots in an inside surface of the computer system enclosure. The rear tabs and inside slots can help to support a weight of the high-capacity computer module and help a user to align the high-capacity computer module in the computer system enclosure.

These and other embodiments of the present invention can provide modules having a robust, low-profile ejection mechanism. The low-profile of the ejection mechanism can help to avoid blockage of airflow from the fans through the high-capacity computer module. The ejection mechanism can be controlled by a lever formed to fit in an opening in an enclosure for the high-capacity computer module. The lever can be flush with module enclosure in the closed position such that it does not create an opening in the enclosure that could cause recirculation of hot air. The lever can be stable in two positions. For example, it can be in a stable position when closed (flush with the enclosure), and it can also be stable when partially opened (extending from the enclosure) to eject the module from the computer system enclosure. The lever can be moved to the partially opened position by a user depressing a first end of the lever into the enclosure of the module. The user can then move the lever to the fully opened position. That is, the use can pull the lever out further in order to eject the module from one or more sockets in the computer system enclosure. A spring can be used with the lever. The spring can resist the user when the user pulls the lever to eject the module. When the lever is released, the spring can drive the lever back to the closed position and the user can remove the module from the computer system enclosure.

These and other embodiments of the present invention can provide enclosures and other structures that form a mechanically robust computer module. For example, a computer module can include a board housed in an enclosure. The enclosure can include a back cover on top of which the board can be fixed. The back cover can extend around a side and partially over a top of the computer module. The enclosure can further include a heat sink that can be placed on, or form an inside surface of a top portion of the device enclosure. A set or stack of fins and an enclosure wall having a number of perforations or openings can form sides of the computer module. The fins can have openings between them. The openings between fins and perforations in the enclosure wall can form ducting for air flow through the computer module. The fins, heat sink, and top portion of the enclosure wall can form structural support for the computer module. The fins, heat sink, and enclosure can interlock to provide a physically robust structure and improved heat dissipation.

These modules can be housed in enclosures that can be formed in various ways in these and other embodiments of the present invention. For example, they can be formed by machining, such as by using computer numerical controlled machines, stamping, forging, metal-injection molding, micro-machining, 3-D printing, or other manufacturing process. These enclosures can be formed of various materials. For example, they can be formed of aluminum, steel, stainless steel, copper, bronze, or other material. In these and other embodiments of the present invention, a material that provides good electrical shielding and thermal conductivity can be chosen.

Embodiments of the present invention can provide high-capacity modules that can be located in various types of devices, such as portable computing devices, tablet computers, desktop computers, laptops, all-in-one computers, wearable computing devices, smart phones, storage devices, portable media players, navigation systems, monitors, power supplies, video delivery systems, adapters, remote control devices, chargers, and other devices.

Various embodiments of the present invention can incorporate one or more of these and the other features described herein. A better understanding of the nature and advantages of the present invention can be gained by reference to the following detailed description and the accompanying drawings.

DESCRIPTION OF ILLUSTRATIVE EMBODIMENTS

Figure 1:
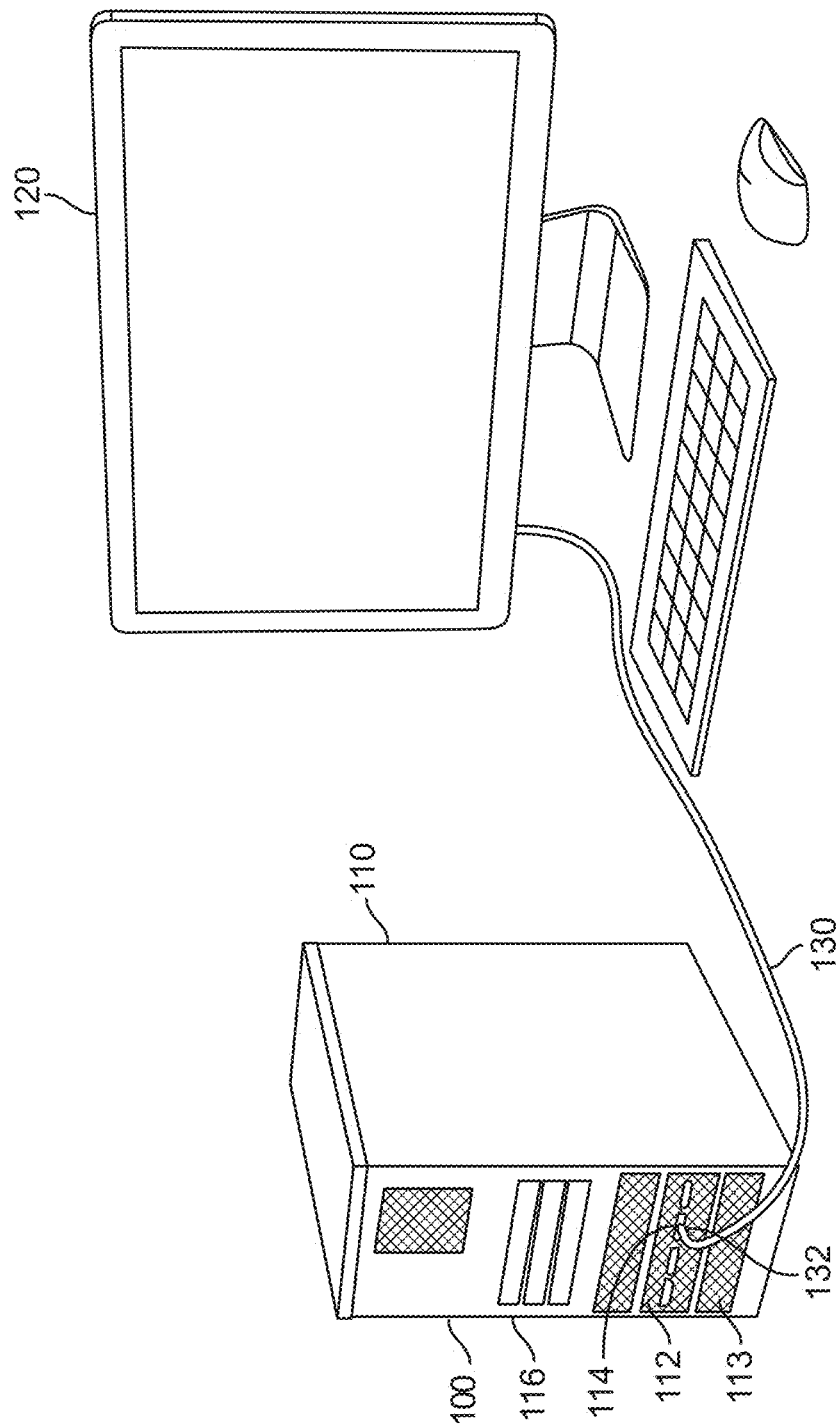
FIG. 1 illustrates an electronic system according to an embodiment of the present invention.

FIG. 1 illustrates an electronic system according to an embodiment of the present invention. This figure, as with the other included figures, is shown for illustrative purposes and does not limit either the possible embodiments of the present invention or the claims.

In this example, an electronic system can include desktop computer 100 that is in communication with monitor 120. Desktop computer 100 can include computer system 110. Computer system 110 can house a high-capacity computer module 200 (shown in FIG. 2) having enclosure wall 112. Computer system 110 can be housed in a device enclosure including computer system enclosure 116 and enclosure wall 112, which can have one or more holes or perforations 113. Desktop computer 100 can use high-capacity computer module 200 to provide graphics information over cable 130 to monitor 120. In these and other embodiments of the present invention, one or more high-capacity computer modules 200 can provide graphics, sound, networking, and other functions for computer system 110. For example, a high-capacity computer module 200 can be graphics module that includes one or more graphics processing units.

Cable 130 can be one of a number of various types of cables. For example, it can be a Universal Serial Bus (USB) cable such as a USB Type-A cable, USB Type-C cable, HDMI, Thunderbolt, DisplayPort, Lightning, or other type of cable. Cable 130 can include compatible connector inserts 132 that plug into connector receptacle 114 on desktop computer 100 and a connector receptacle (not shown) on monitor 120. High-capacity computer module 200 can include additional connector receptacles, audio jacks, or other connectors along with connector receptacle 114.

In other embodiments of the present invention, either or both desktop computer 100 and monitor 120 can instead be portable computing devices, tablet computers, desktop computers, laptops, all-in-one computers, wearable computing devices, smart phones, storage devices, portable media players, navigation systems, monitors, power supplies, video delivery systems, adapters, remote control devices, chargers, or other devices.

Figure 2:
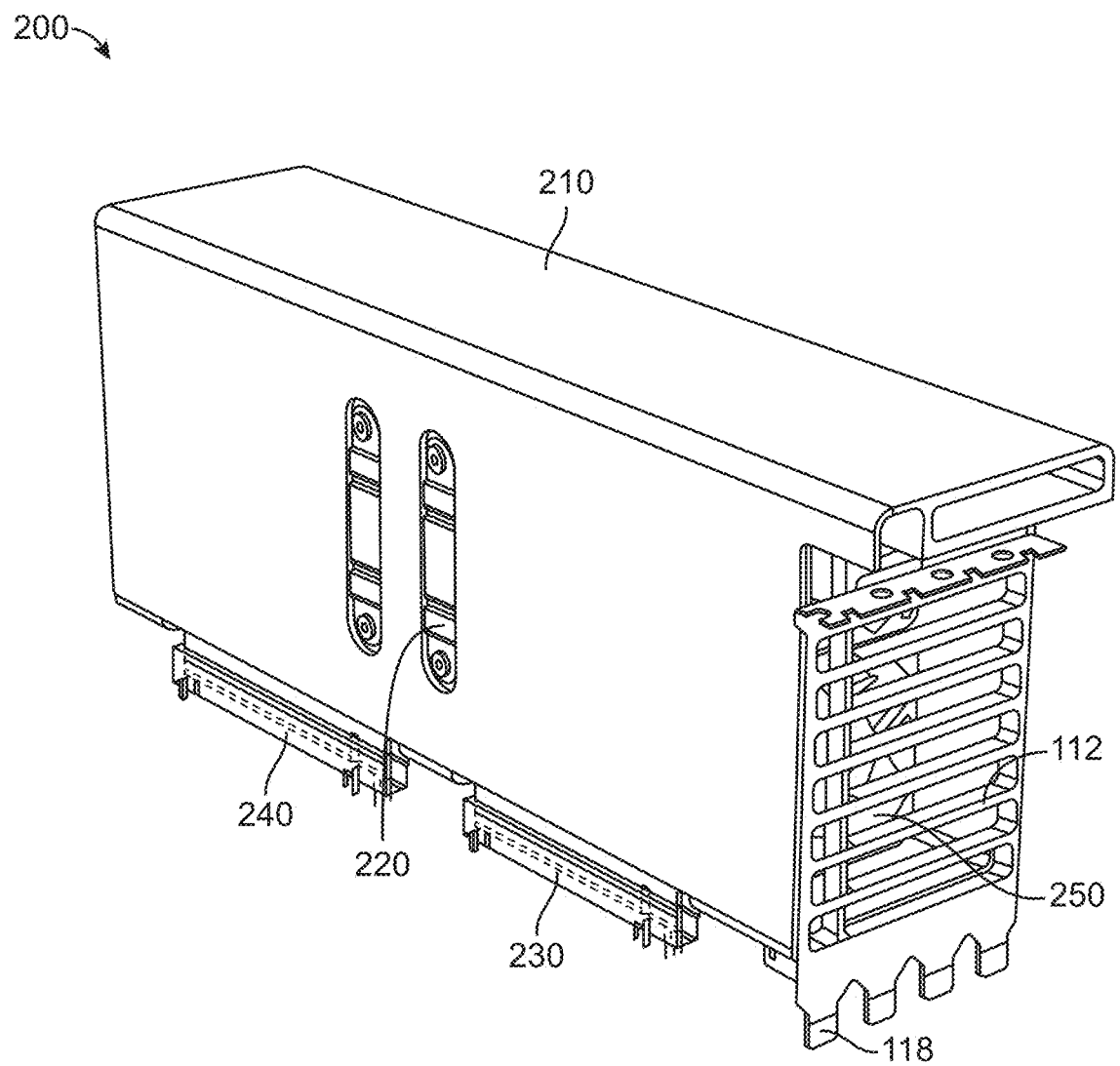
FIG. 2 illustrates a high-capacity computer module according to an embodiment of the present invention.

FIG. 2 illustrates a high-capacity computer module according to an embodiment of the present invention. High-capacity computer module 200 can be housed in an enclosure 210. Module 200 can include an enclosure wall 112 over a front side. Enclosure wall 112 can include tabs 118 that can fit in notches in computer system enclosure 116 (shown in FIG. 1.) Enclosure wall 112 can be formed in various ways and can be formed of various materials. Further details of enclosure walls 112, including their structure, methods of manufacturing, and the materials that can be used, can be found in co-pending U.S. Provisional Patent Application No. 62/736,299, titled "HOUSING CONSTRUCTION," filed Sep. 25, 2018, and co-pending U.S. Patent application Ser. No. 16/412,240, titled "HOUSING CONSTRUCTION," filed May 14, 2019, which are incorporated by reference. Module 200 can include one or more fans 250, though module 200 might not include fans, as shown below in FIGS. 5 and 6.

High-capacity computer module 200 can include board 220 having one, two, or more than two card edges, shown here as card edges 230 and 240. In these and other embodiments of the present invention, either or both card edges 230 and 240 can be compliant with a standard, such as a PCI-type standard or other standard. For example, they can have a shape and pinout that can be compatible with the ISA, PCI, PCIe, PCI-X, AGP, or other standard presently used, that are being developed, or that might be developed in the future (again, presently referred to here as a standard, or PCI-type or PCIe-type.) Either or both card edges 230 and 240 can be a proprietary card edge that is not a PCI-type or other standard card edge. Card edges 230 and 240 can be along a same side of a board 220, they can be on different sides of board 220, or they can be on different boards.

High-capacity computer module 200 can have various sizes. For example, module 200 can be two, three, four, or more than four times the width of a conventional computer module. Module 200 can have an increased height (in the vertical direction as shown.) For example, module 200 can be 20 percent, 25 percent, 30 percent, 33 percent, or more than 33 percent taller than a conventional computer module. A length or depth of module 200 can also be longer than a conventional computer module. This additional volume can allow a higher degree of functionality to be included in high-capacity computer module 200 as compared to a conventional computer module.

Figure 3:
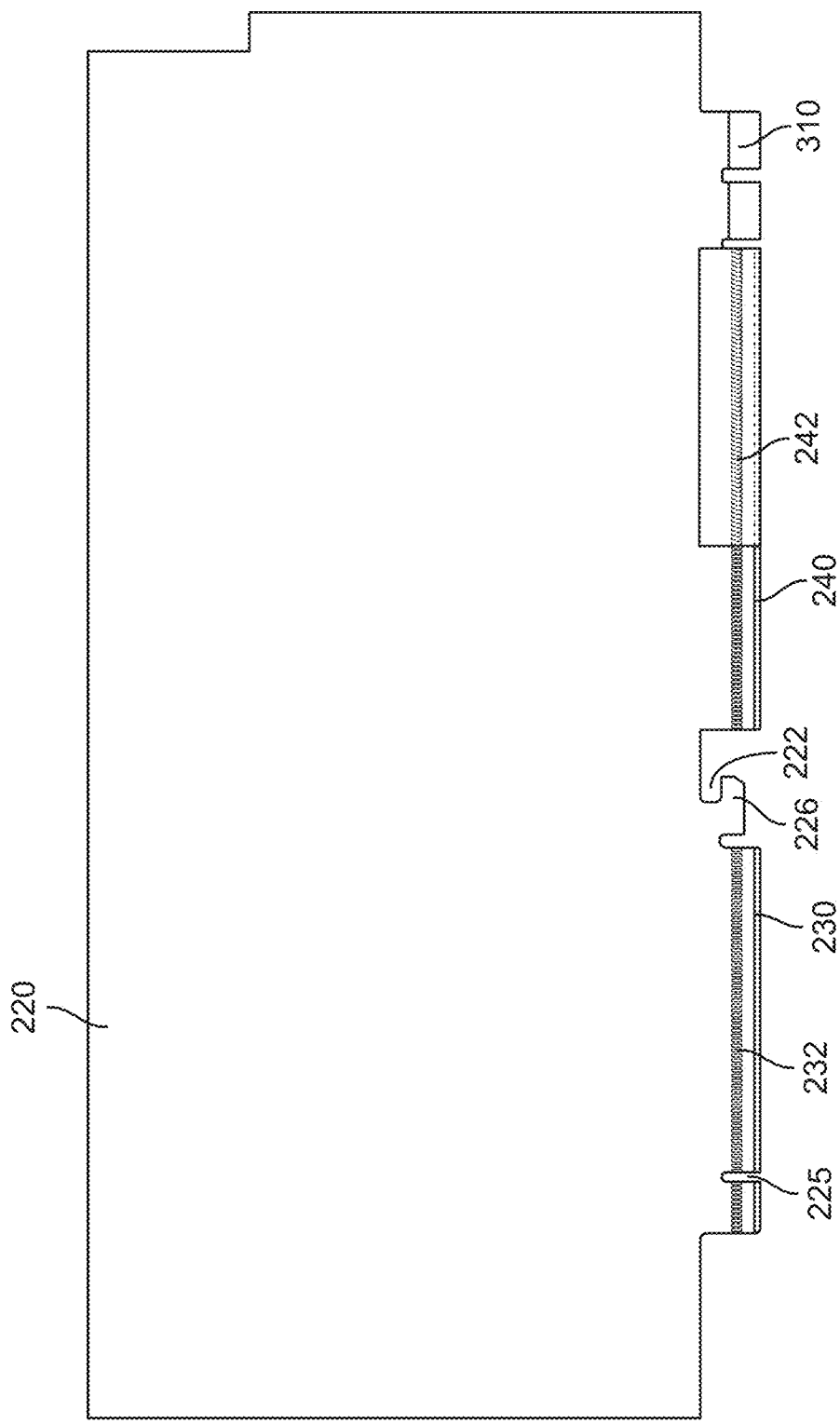
FIG. 3 illustrates a module board for a high-capacity computer module according to an embodiment of the present invention.
Figure 7:
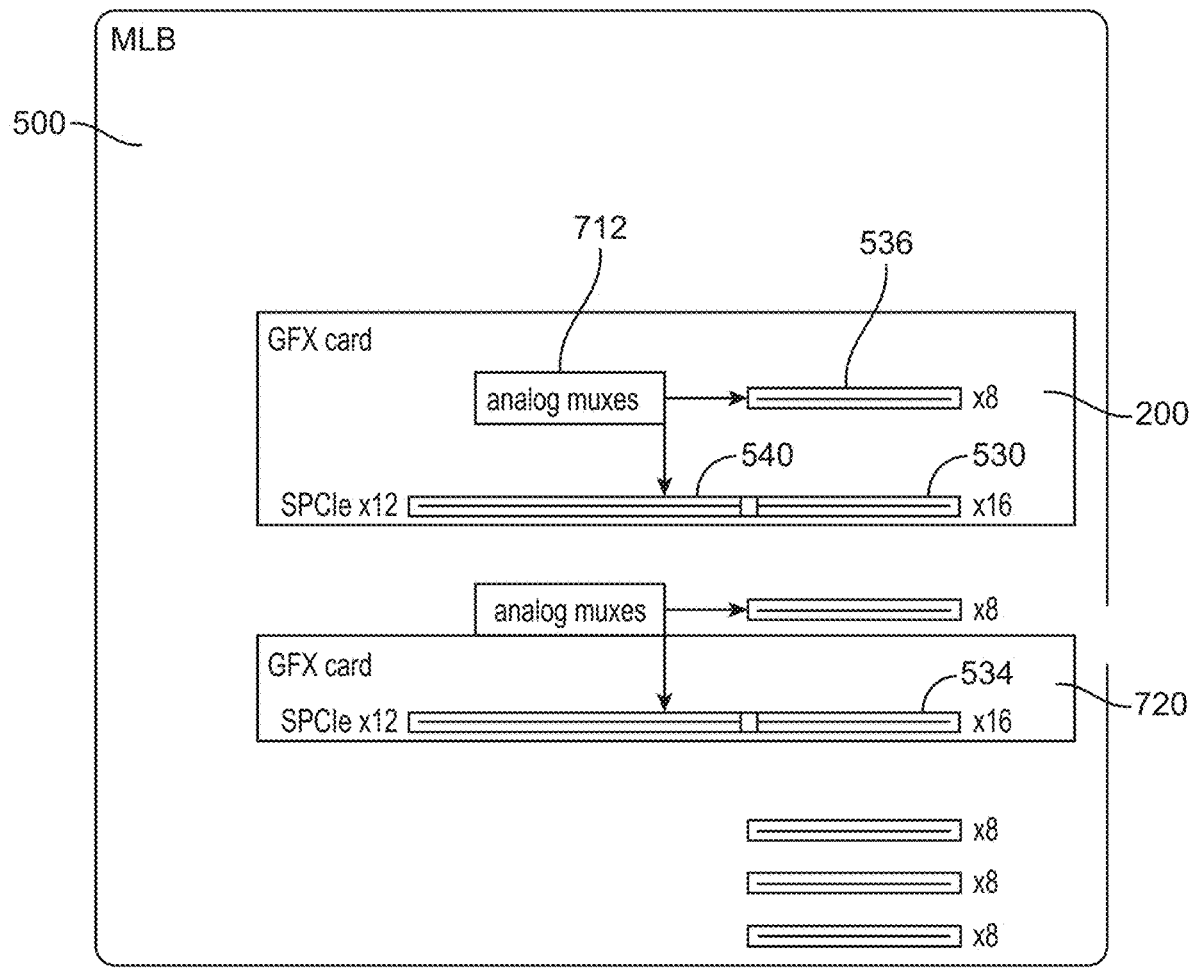
FIG. 7 illustrates a portion of a main-logic board for a computer system according to an embodiment of the present invention.
Figure 21:
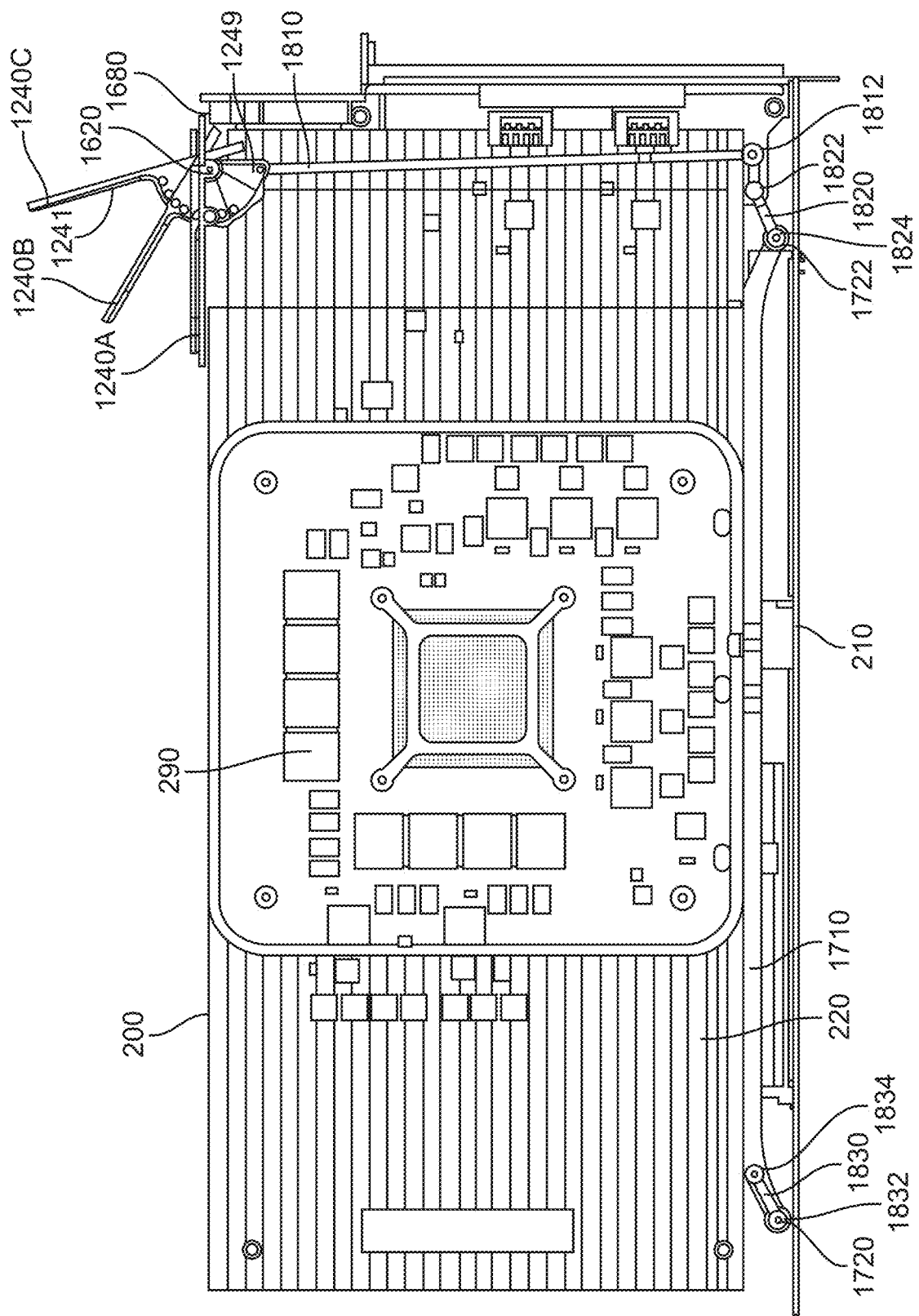
FIG. 21 is another view of the ejection mechanism for a high-capacity computer module of FIG. 20.
Figure 22:
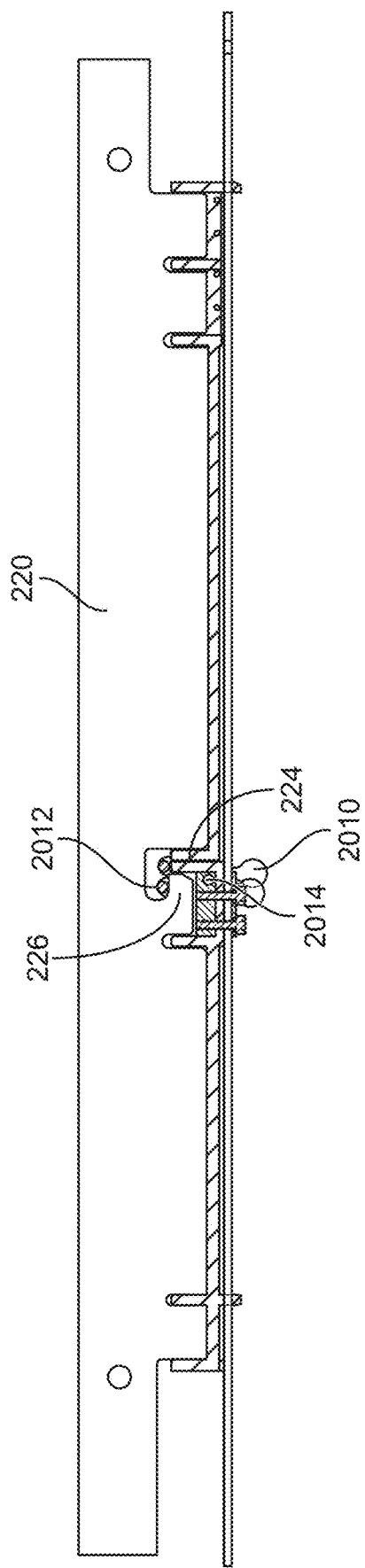
FIG. 22 illustrates a latching mechanism to secure a high-capacity computer module in place according to an embodiment of the present invention.

FIG. 3 illustrates a module board for a high-capacity computer module according to an embodiment of the present invention. In this example, board 220 can include two card edges, specifically card edge 230 and card edge 240. Card edge 230 can include a number of contacts 232, while card edge 240 can include a number of contacts 242. Either or both card edge 230 and card edge 240 can be compliant with a standard, such as a PCI-type standard or other standard. For example, card edge 230 can be a PCI-type card edge. That is, card edge 230 can have a shape and pinout that is compliant with a PCI-type standard, such as PCIe, PCI-X, or other standard. Either or both card edge 230 and card edge 240 can be a proprietary or nonstandard card edge. For example, card edge 240 can be a proprietary card edge. Card edges 230 and 240 can include one or more keying features 225 to help to prevent improper insertion of card edges 230 and 240 into corresponding sockets 530 and 540, as shown in FIG. 7. Tab 226 can be included for PCI compliance and to operate with a latching mechanism as shown in FIGS. 21 and 22.

Board 220 can further include power contacts 310. Including larger-sized power contacts 310 on board 220 can simplify design of computer system enclosure 116 (shown in FIG. 1) that houses high-capacity computer module 200 (shown in FIG. 2) having board 220. For example, a high performance graphics module can require a power connection to be made through a cable connected to the graphics module. By utilizing power contacts 310, the need for such a power cable connection can be obviated.

The inclusion of proprietary card edge 240 can further simplify the design of computer system enclosure 116 (shown in FIG. 1) by including additional data lines on contacts 242. For example, these extra data lines can include additional PCIe lanes. In these and other embodiments of the present invention, card edge 230 can convey four, eight, 16, or other numbers of PCIe lanes. Card edge 240 can convey an additional two, four, eight, or 16 lanes of PCIe data to board 220. Contacts 242 on card edge 240 can also include contacts for DisplayPort lanes in order to provide DisplayPort data to a system mater controller (not shown.) That is, where board 220 is included in a graphics module, contacts 242 can provide DisplayPort data to the computer system controller directly, which can obviate the need for a separate cable to convey this data, thereby simplifying the design of the computer system.

Figure 4:
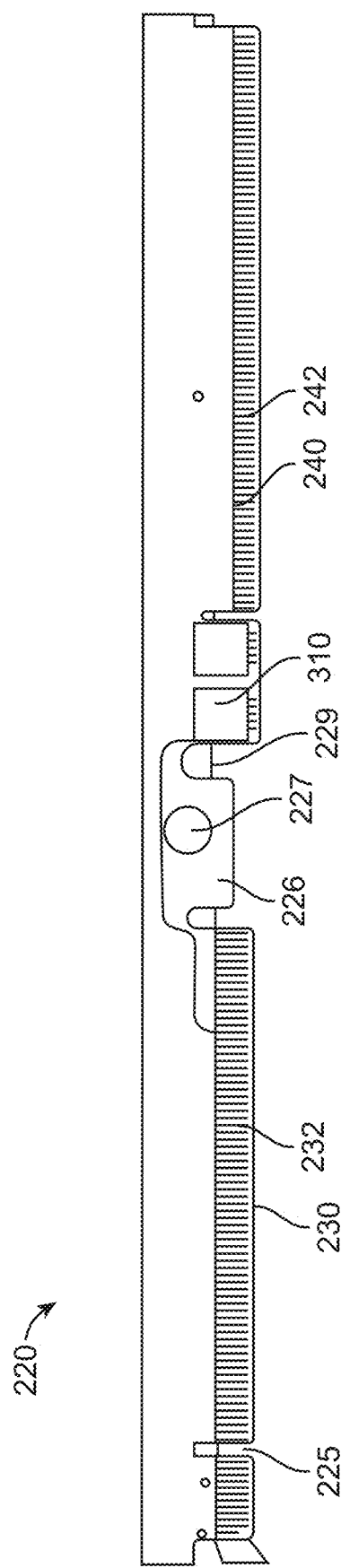
FIG. 4 illustrates a module board for a high-capacity computer module according to an embodiment of the present invention.

FIG. 4 illustrates a portion of a module board for a high-capacity computer module according to an embodiment of the present invention. In this example, board 220 can include two card edges, specifically card edge 230 and card edge 240. Card edge 230 can include a number of contacts 232, while card edge 240 can include a number of contacts 242. Either or both card edge 230 and card edge 240 can be compliant with a standard, such as a PCI-type standard or other standard. For example, card edge 230 can be a PCI-type card edge. That is, card edge 230 can have a shape and pinout that is compliant with a PCI-type standard, such as PCIe, PCI-X, or other standard. Either or both card edge 230 and card edge 240 can be a proprietary or nonstandard card edge. For example, card edge 240 can be a proprietary card edge. Card edges 230 and 240 can include one or more keying features 225 to help to prevent improper insertion of card edges 230 and 240 into corresponding sockets 530 and 540, as shown in FIG. 7. Tab 226 and opening 227 can be included for PCI compliance and to operate with a latching mechanism (not shown.) Notch 229 can be sized relative large to accommodate a reinforcing structure in socket 540, such as pin 547, shown in FIG. 24.

Board 220 can further include power contacts 310. Including larger-sized power contacts 310 on board 220 can simplify design of computer system enclosure 116 (shown in FIG. 1) that houses high-capacity computer module 200 (shown in FIG. 2) having board 220. For example, a high performance graphics module can require a power connection to be made through a cable connected to the graphics module. By utilizing power contacts 310, the need for such a power cable connection can be obviated. Centering power contacts 310 between card edge 230 and card edge 240 can reduce trace length of the power supplies.

The inclusion of proprietary card edge 240 can further simplify the design of computer system enclosure 116 (shown in FIG. 1) by including additional data lines on contacts 242. For example, these extra data lines can include additional PCIe lanes. In these and other embodiments of the present invention, card edge 230 can convey four, eight, 16, or other numbers of PCIe lanes. Card edge 240 can convey an additional two, four, eight, or 16 lanes of PCIe data to board 220. Contacts 242 on card edge 240 can also include contacts for DisplayPort lanes in order to provide DisplayPort data to a system mater controller (not shown.) That is, where board 220 is included in a graphics module, contacts 242 can provide DisplayPort data to the computer system controller directly, which can obviate the need for a separate cable to convey this data, thereby simplifying the design of the computer system.

As shown in FIG. 2, high-capacity computer module 200 can include one or more fans 250. In these and other embodiments of the present invention, fans 250 can be omitted from module 200, and instead fans 520 (shown in FIG. 5) can be placed external to high-capacity computer module 200 in computer system enclosure 116 for computer system 110 (both shown in FIG. 1.) This can help to simplify a design of computer system enclosure 116 as well as computer module 200. For example, one, two, three, or more than three fans 520 can be located at a front (or another side)

of computer system enclosure 116 (shown in FIG. 1.) These fans 520 can move air along a length of high-capacity computer module 200 and out the back (or another side) of computer system enclosure 116. By not including fans 250 in computer modules 200, recirculation of hot air in computer modules 200 can be avoided. For example, computer modules 200 can include fins 1230 (shown in FIG. 12) or other ducting structures in order to guide the airflow and avoid recirculation. A number of fans 520 sufficient to cool a first number of high-capacity computer modules 200 and standard computer modules (not shown) can be included. Where less than the first number of high-capacity computer modules 200 and standard computer modules are included, one or more fans 520 can be powered down or run at a slower speed, for example to prevent recirculation. Since fans 520 are not included in high-capacity computer modules 200 themselves, they can be larger in size and can therefore generate less noise by operating at a lower speed. Examples are shown in the following figures.

Figure 5:
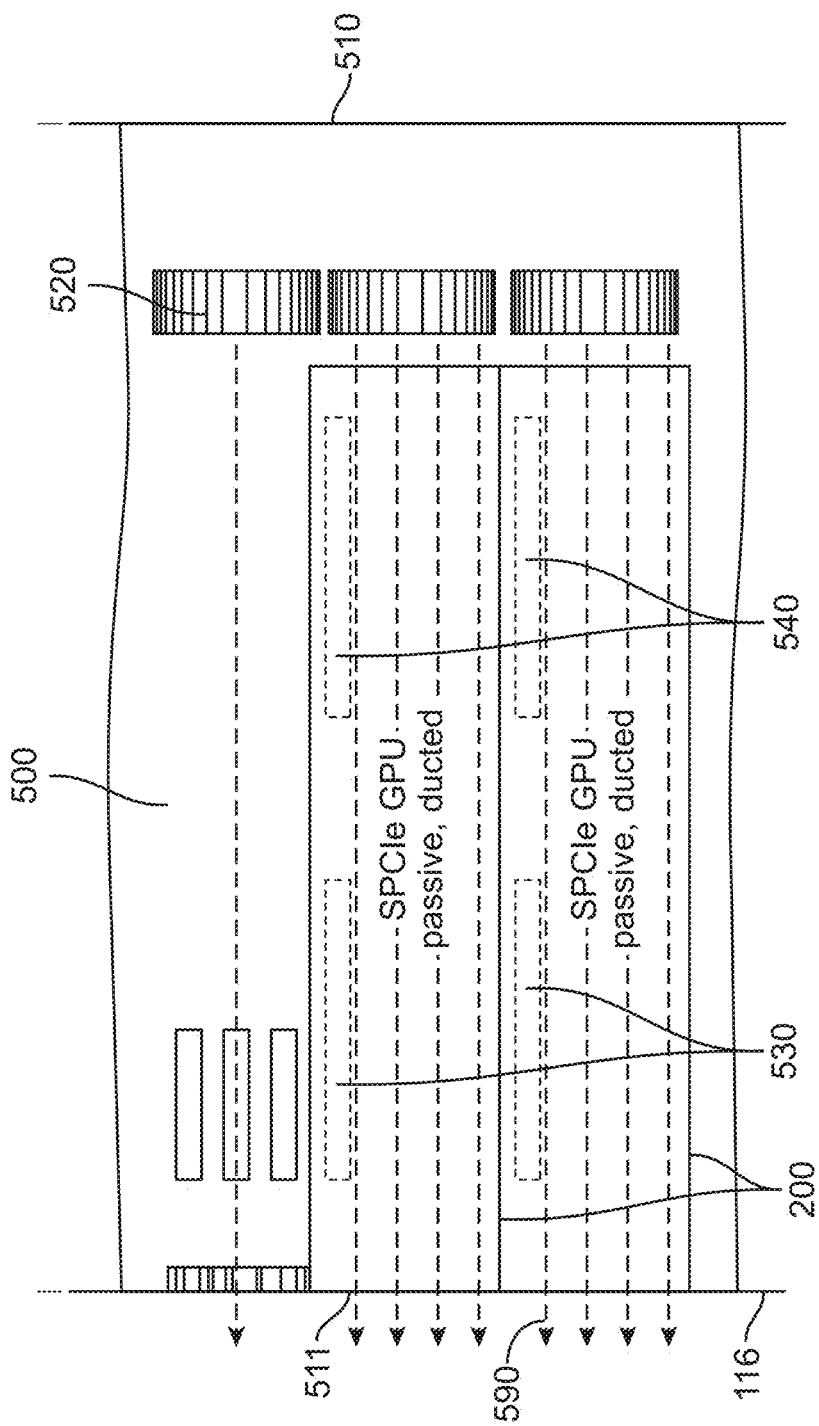
FIG. 5 illustrates a portion of a computer system according to an embodiment of the present invention.

FIG. 5 illustrates a portion of a computer system according to an embodiment of the present invention. This computer system can include two high-capacity computer modules 200, which can be inserted into sockets 530 and 540 on main-logic board 500. The computer system can be housed in computer system enclosure 116. Fans 520 can move air from a front 510 of the computer system enclosure 116 and out a backside 511 as illustrated by flow paths 590, though in these and other embodiments of the present invention, air can flow from backside 511 towards front 510 of computer system enclosure 116, or air can flow in another direction. For example, computer system enclosure 116 can include one or more ducts (not shown) to guide airflow in and out of the same or different sides of computer system enclosure 116. Again, in these and other embodiments of the present invention, fans 250 (shown in FIG. 2) can be absent from modules 200 and can instead fans 520 can be located in computer system enclosure 116. By not including fans 250 in computer modules 200, recirculation of hot air in computer modules 200 can be avoided. Also, since fans 250 are not included in the high-capacity computer modules 200 themselves, fans 520 can be larger in size and can therefore generate less noise by operating at a slower speed. Fans 520 can be located on main-logic board 500, they can be located on computer system enclosure 116, or they can be located elsewhere in computer system 110 (shown in FIG. 1.) Fans 520 can be at least approximately aligned with an end of computer modules 200, for example, a fan 520 can be aligned with an end of computer module 200 having a plurality of fins 1230 or other vent structures.

Figure 6:
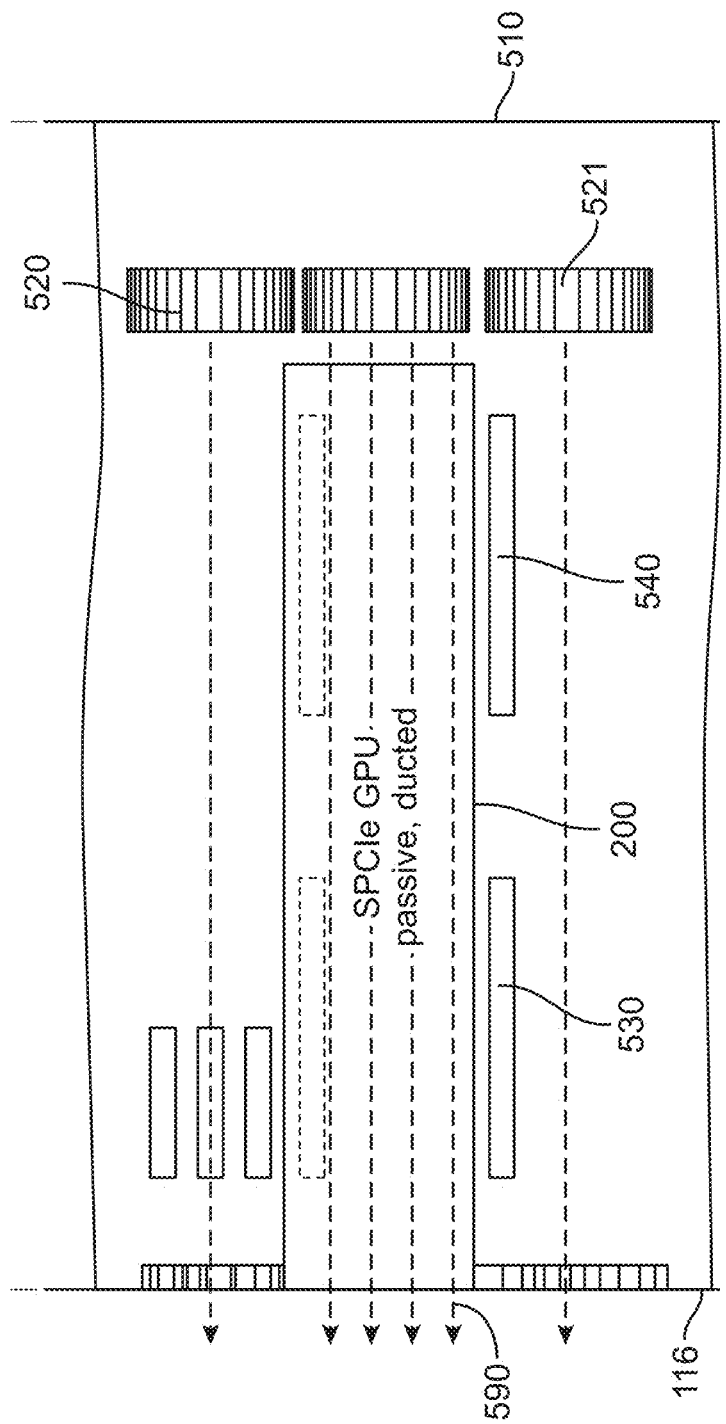
FIG. 6 illustrates a portion of a computer system according to an embodiment of the present invention.

FIG. 6 illustrates a portion of a computer system according to an embodiment of the present invention. Fans 520 can again move air from a front 510 (or rear or other portion) of computer system enclosure 116, shown here again as flow paths 590. In this particular example, the computer module 200 that had been located in front of fan 521 has been removed from sockets 530 and 540. Accordingly, fan 521 can be powered down such that it either is stopped or spins at a lower speed, for example to prevent recirculation. This powering down can help to reduce noise and save power, as well as extend the life of fan 521. Specifically the system can detect that a module 200 in front of fan 521 is not present. The system can then adjust the speed of fan 521 to a slower speed, or it can stop fan 521. When the system detects that a module 200 is in front of fan 521, it can adjust the speed of the fans 521 and 520 to be at least approximately equal, though fans might not be set at the exact same speed to avoid acoustic artifacts. This is explained further below. This can provide a fan 520 or 521 for computer system enclosure 116 that is controlled to have a speed that is dependent on, and at least partially determined by, the presence or absence of modules 200 in sockets 530 and 540, as well as other parameters or information as outlined further below.

These and other embodiments of the present invention can provide computers that include computer modules 200 and computer systems 110 that work together to provide cooling for computer modules 200. For example, computer module 200 can communicate one or more parameters or other information to a system controller or other circuit (not shown) in computer system 110 housing the computer module (for example in a computer system enclosure.) These parameters or other information can be sent using sockets 530 or 540, it can be sent wirelessly, or it can be sent in another way. At least partially in response to these parameters of other information, the system controller or other circuit in computer system 110 (referred to as computer system 110 for simplicity) can adjust a speed of one or more fans in computer system enclosure 116. These parameters can include a temperature of computer module 200 or one or more components or circuits 290 (shown in FIG. 6) in computer module 200, the power being dissipated by computer module 200, a maximum allowable temperature of one or more components or circuits 290 of computer module 200, or other parameter or information. For example, computer module 200 can send a maximum allowable temperature of one or more components or circuits 290 along with a present temperature of computer module 200 to computer system 110. Computer system 110 can then adjust the speed of fans 520 or 521 in computer system enclosure 116 to ensure that the maximum temperature is not exceeded.

Figure 10:
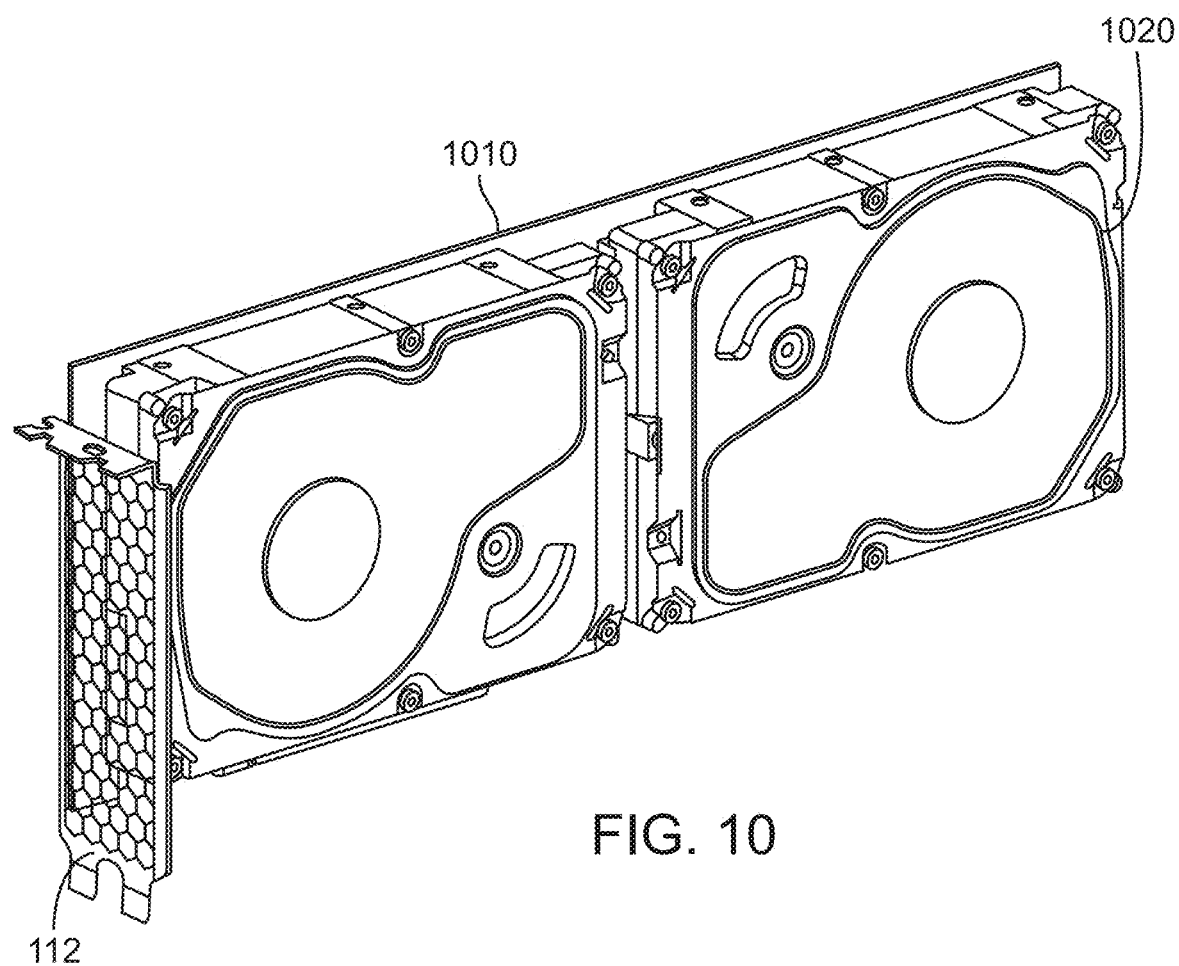
FIG. 10 illustrates another high-capacity computer module having increased storage capabilities according to an embodiment of the present invention.

In these and other embodiments of the present invention, other parameters or other information can be provided from computer module 200 to computer system 110. For example, computer module 200 can provide an expected cooling profile to computer system 110, where the expected cooling profile informs computer system 110 to expect a certain temperature for computer module 200 given a speed of fans 520 or 521. Also, parameters or other information that identify the type of computer module 200 can be provided by computer module 200 to the computer system 110. This can be used by computer system 110 to adjust a speed of one or more fans 520 or 521 in computer system enclosure 116. For example, computer module 200 housing several hard-disk drives or storage modules 1020 (as shown in FIG. 10) might need to operate at a different temperature than a computer module 200 housing a graphics processing unit. These and other parameters or other information can be used, along with information regarding the presence or absence of computer modules 200 in sockets 530 and 540, to set a speed for either or both fans 520 and 521. For example, a speed of either or both fans 520 and fan 521 can be at least partially determined by the presence or absence of computer modules 200 in sockets 530 and 540, parameters or other information provided by one or more computer modules 200 in sockets 530 and 540, parameters or other information provided by one or more computer modules in other sockets in computer system enclosure 116, as well as other parameters or other information.

In these and other embodiments of the present invention, other parameters or other information can be provided from computer system 110 to computer module 200. These parameters or other information can be sent using sockets 530 or 540, it can be sent wirelessly, or it can be sent in another way. For example, computer system 110 can inform computer module 200 that all fans 520 and 521 are operating at full speed. This can in turn cause computer module 200 to reduce functionality, lower clock rates, or take other action to control or reduce its temperature. Similarly, computer system 110 can inform computer module 200 that one or more fans 520 or 521 are inoperative, or that it is presently undesirable to increase a speed of one or more fans 520 or 521. Mitigation steps can then be taken by computer module 200 to adjust its power as needed.

The speeds of the one or more fans 520 and 521 in computer system enclosure 116 can also be adjusted individually or as a group to avoid vibration or acoustic artifacts. For example, instead of having two or more fans 520 and 521 running at the same speed, the speeds of fans 520 or 521 can be offset by an amount to avoid the constructive interference that could otherwise increase noise. For similar reasons, two or more fans 520 or 521 can be controlled to not spin at frequencies that are harmonics or multiples of each other, or that have other relationships.

Again, embodiments of the present invention can provide computer systems and high-capacity computer modules that utilize resources in an efficient manner. For example, where circuitry and associated data paths might not be able to be used at a first socket, they can be rerouted for use at a second socket. An example is shown in the following figure.

FIG. 7 illustrates a portion of a main-logic board for a computer system according to an embodiment of the present invention. In this example, high-capacity computer module 200 has been inserted into sockets 530 and 540 on main-logic board 500. Sockets 530 and 540 can be one or two individual sockets. Sockets 530 and 540 can be formed separately or they can be integrally formed as a single piece. In this example, high-capacity computer module 200 can be twice the width of a conventional computer module, shown here as computer module 720, which is inserted into socket 534. In this example, socket 536 and its associated circuitry would not be able to be used by a second computer module, as it is covered by module 200. Accordingly, some of all of the signal paths associated with socket 536 can be rerouted through multiplexers 712 to socket 540, where they can be used by module 200. Multiplexers 712 can be analog multiplexers. For example, they can be a number of pass gates or transmission gates. Multiplexers 712 can instead be digital multiplexers. The use of multiplexers 712 can simplify design of circuitry associated with main-logic board 700, since separate circuitry does not need to be associated with both sockets 536 and 540.

Embodiments of the present invention can provide high-capacity computer modules having increased functionality. Examples are shown in the following figures.

Figure 8:
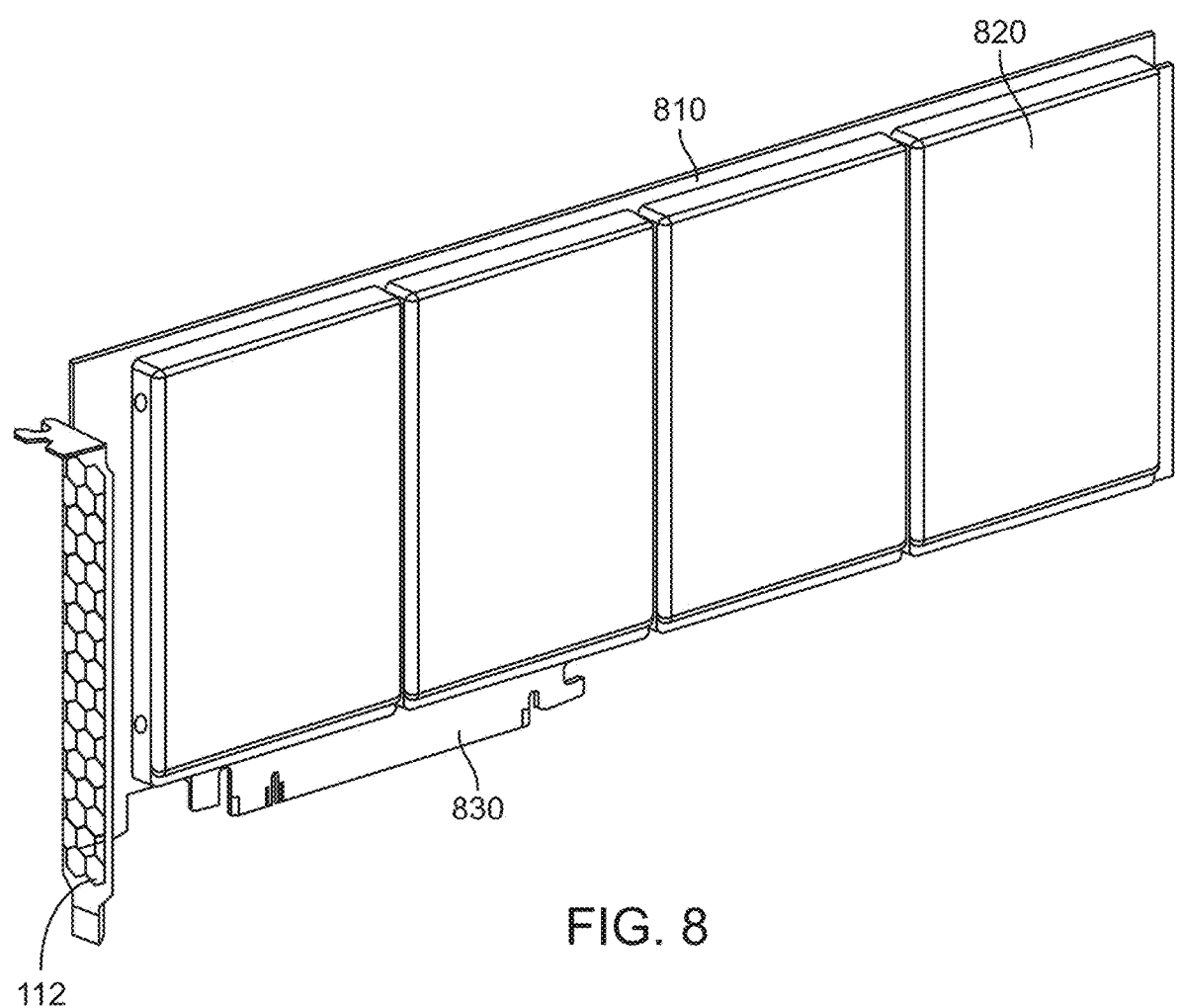
FIG. 8 illustrates a high-capacity computer module having increased storage capabilities according to an embodiment of the present invention.

FIG. 8 illustrates a high-capacity computer module having increased storage capabilities according to an embodiment of the present invention. In this example, module board 810 can have an increased height, length, or height and length as compared to a conventional module board. This can allow the inclusion of an increased number of storage modules 820 on module board 810. In this example, four storage modules 820 are shown on module board 810. Storage modules 820 can be 2.5 inch solid state drives, or other types of storage. Instead of modules for data storage, batteries (not shown) can be included on module board 810. Module board 810 can include card edge 830, which can be a PCIe or other type of standard or proprietary card edge. Module board 810 can further include one or more additional card edges that are either standard or proprietary card edges. This high-capacity computer module can also include enclosure wall 112.

Figure 9:
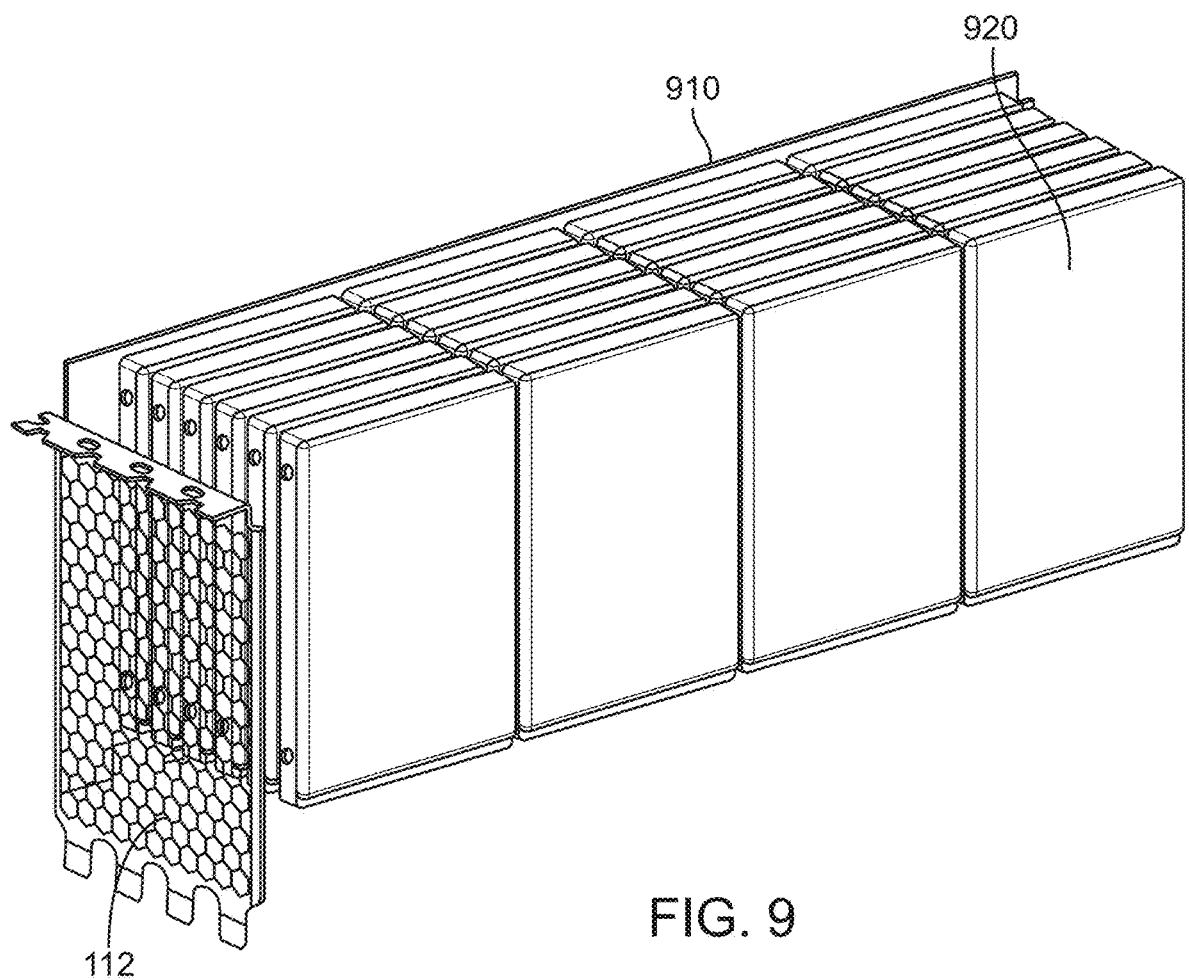
FIG. 9 illustrates another high-capacity computer module having increased storage capabilities according to an embodiment of the present invention.

FIG. 9 illustrates another high-capacity computer module having increased storage capabilities according to an embodiment of the present invention. In this example, module board 910 can have increased height, length, or height and length as compared to a conventional module board. Enclosure wall 112 can also be wider than a conventional module. For example, it can be two, three, four, or more than four times as wide as a conventional computer module. This can allow storage modules 920 to be stacked in multiples as shown. In this example, twenty-four storage modules 920 are shown on module board 910. Storage modules 920 can be 2.5 inch solid state drives, or other types of storage. Instead of modules for data storage, batteries (not shown) can be included on module board 910. Module board 910 can include a card edge (not shown), which can be a PCIe or other type of standard or proprietary card edge. Module board 910 can further include one or more additional card edges that are either standard or proprietary card edges.

FIG. 10 illustrates a high-capacity computer module having increased storage capabilities according to an embodiment of the present invention. In this example, module board 1010 can have an increased height, length, or height and length as compared to a conventional module board. This can allow the inclusion of an increased number of storage modules 1020 on module board 1010. In this example, two storage modules 1020 are shown on module board 1010. Storage modules 1020 can be 3.5 inch hard-disk drives, or other types of storage. Instead of modules for data storage, batteries (not shown) can be included on module board 1010. Module board 1010 can include a card edge (not shown), which can be a PCIe or other type of standard or proprietary card edge. Module board 1010 can further include one or more additional card edges that are either standard or proprietary card edges. This high-capacity computer module can also include enclosure wall 112.

Figure 11:
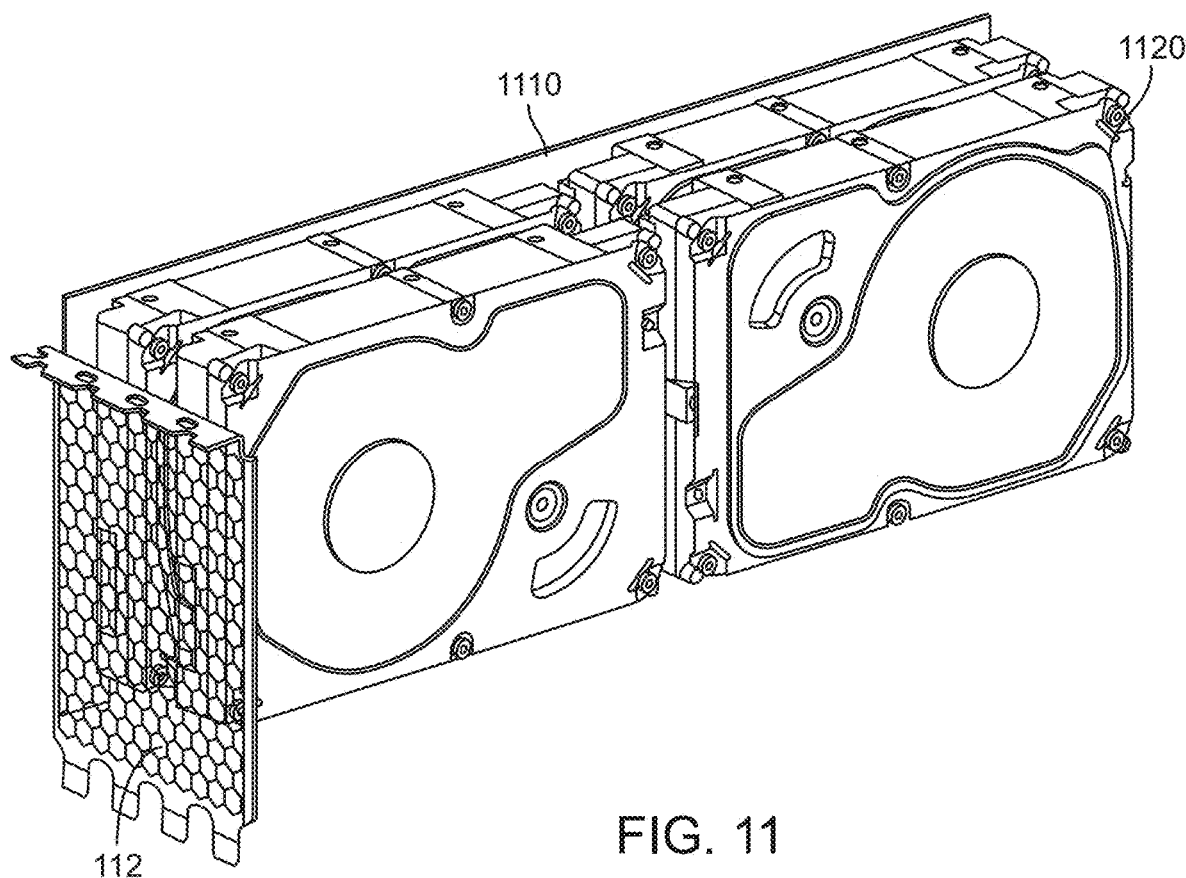
FIG. 11 illustrates another high-capacity computer module having increased storage capabilities according to an embodiment of the present invention.

FIG. 11 illustrates another high-capacity computer module having increased storage capabilities according to an embodiment of the present invention. In this example, module board 1110 can have increased height, length, or height and length as compared to a conventional module board. Enclosure wall 112 can also be wider than a conventional module. For example, it can be two, three, four, or more than four times as wide as a conventional computer module. This can allow storage modules 1120 to be stacked in multiples as shown. In this example, four storage modules 1120 are shown on module board 1110. Storage modules 1120 can be 3.5 inch hard-disk drives, or other types of storage. Instead of modules for data storage, batteries (not shown) can be included on module board 1110. Module board 1110 can include a card edge (not shown), which can be a PCIe or other type of standard or proprietary card edge. Module board 1110 can further include one or more additional card edges that are either standard or proprietary card edges.

The computer modules 200 shown here can include one, two, or more that two module boards, such as module board 220 (shown in FIG. 2) or the other module boards shown here. Each module board can include one, two, or more than two card edges, such as card edge 230 or card edge 240 (shown in FIG. 2.) Each of these card edges can be proprietary card edges, or they can be card edges that are compliant with the ISA, PCI, PCIe, PCI-X, AGP, or other standard that is presently used, is being developed, or that might be developed in the future. The proprietary card edge can have a different shape and pinout as a PCI-type card edge, or it can have the same or similar shape or pinout.

Where a card has two card edges, the two card edges can be inserted into sockets, such as sockets 530 and 540 (shown in FIG. 5) on a main-logic board, such as main-logic board 500 (shown in FIG. 5) or elsewhere in computer system enclosure 116, where the sockets are formed as two separate sockets or where the sockets are integrally formed as a single socket. These and other embodiments of the present invention can also provide computer modules 200 having module boards, such as module board 220, having three or more card edges. These three or more card edges can be along a same or different sides of the module board. Each of the three card edges can be a PCI-type or other standard card edge or a proprietary or nonstandard edge that is not a PCI-type of other standard card edge. These three or more card edges can be inserted into sockets, such as sockets 530 and 540 (shown in FIG. 5) on a main-logic board, such as main logic-board 500 (shown in FIG. 5) or elsewhere in the computer system enclosure 116. The three or more sockets can be separate sockets, they can be formed as two sockets, or they can be integrally formed as a single socket.

These and other embodiments of the present invention can provide computer modules 200 that include more than one module board, such as module board 220 (shown in FIG. 2), or other module board. For example, a computer module 200 that is larger than a standard module can utilize the additional space by including additional boards, circuits, heat sinks, or other structures or components. Two or more such module boards can be included and they can each have different card edges, such as card edges 230 or 240 (shown in FIG. 2), though card edges can be omitted on one or more of these additional cards. For example, a first module board can have a PCI-type card edge, while a second module board can have a nonstandard card edge. A first module board can have two card edges along a same side, or different sides, where one edge can be a PCI-type or other standard card edge and a second card edge can be a proprietary or nonstandard edge, while a second module board can have a PCI-type or other standard card edge. A first module board can have two card edges along a same side, or different sides, where one edge can be a PCI-type or other standard card edge and a second card edge can be a proprietary or nonstandard edge, while a second module board can have a nonstandard card edge. A first module board can have two card edges along a same side, or different sides, where one edge can be a PCI-type or other standard card edge and a second card edge can be a proprietary or nonstandard edge, while a second module board can have two card edges along a same side, or different sides, where one edge can be a PCI-type or other standard card edge and a second card edge can be a proprietary or nonstandard edge. A first module board can have two card edges along a same side, or different sides, where one edge can be a PCI-type or other standard card edge and a second card edge can be a proprietary or nonstandard edge, while a second module board might not include a card edge. A computer module 200 can further have three or more than three of these boards. These module boards can be isolated from each other, or they can share electrical resources, physical resources, or both, such as an enclosure, data, power, a heat sink, or other resource. The modules can include a bridge or other pathway for data, and possibly power, to be shared among circuits on two or more module boards. These card edges can be inserted into corresponding sockets, such as sockets 530 and 540 (shown in FIG. 5) in computer system enclosure 116, though in some embodiments of the present invention, one or more such card edges might not be inserted into a corresponding socket in some circumstances. In one example, a computer module can include a first module board having a first card edge and a second module board with no card edges. A data bus can be coupled to transfer data between the first module board and the second module board. A heat sink can be shared between the first board and the second board. For example, a heat sink can be physically placed between the first board and the second board. The first board can optionally have a second card edge, where either or both the first card edge and the second card edge can be a standard card edge or a nonstandard card edge.

Again, these and other embodiments of the present invention can provide high-capacity computer modules that are larger than conventional computer modules. For this reason, these high-capacity computer modules can be correspondingly heavier. Accordingly, these modules can include features that make them easier to insert into and remove from computer system enclosures, such as computer system enclosure 116 (shown in FIG. 1.) Examples are shown in the following figures.

Figure 12:
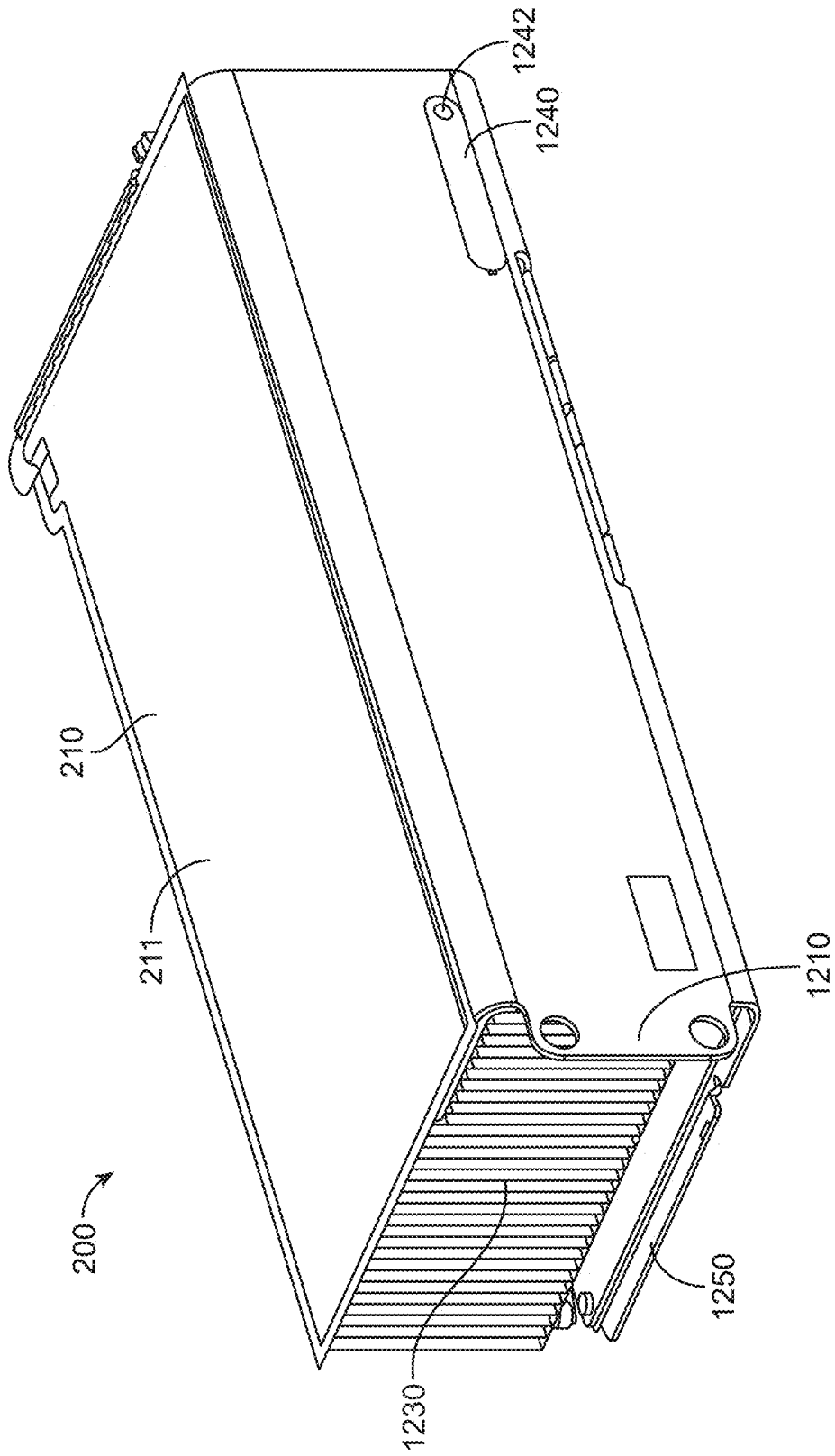
FIG. 12 illustrates a high-capacity computer module according to an embodiment of the present invention.

FIG. 12 illustrates a high-capacity computer module according to an embodiment of the present invention. High-capacity computer module 200 can be housed in enclosure 210. Enclosure 210 can include or support a number of fins 1230 forming openings. Fins 1230 can extend laterally through at least a portion device enclosure 210 and be attached to the top surface 211 of enclosure 210. Fins 1230 can be part of a fin cover 2860 (shown in FIG. 28.) Fans 520 (shown in FIG. 5) can drive air laterally through device enclosure 210 between fins 1230 and out enclosure wall 112 (shown in FIG. 1.) That is, fins 1230 can provide ducting to guide an airflow provided by one or more fans 520 through device enclosure 210 of computer module 200. Enclosure 210 can include one or more tabs, such as tab 1210. These tabs can be used to align high-capacity computer module 200 in computer system enclosure 116 (shown in FIG. 1) during insertion. For example, tab 1210 can be inserted in a corresponding slot 2830 (shown in FIG. 28) in computer system enclosure 116 during insertion. This can help to position and support the weight of high-capacity computer module 200. Tab 1250 can be inserted into a slot 2840 (shown in FIG. 28) in computer system enclosure 116.

These and other embodiments of the present invention can further include an ejection mechanism that can push card edges 230 and 240 of board 220 (shown in FIG. 4) of a high-capacity computer module 200 out of one or more corresponding sockets 530 and 540 (shown in FIG. 7), thereby facilitating its removal. The ejection mechanism can be controlled by lever 1240. For example, lever 1240 can have a location 1242 that when pushed by a user ejects or begins an ejection process of high-capacity computer module 200. Further details are shown in the following figures.

Figure 13:
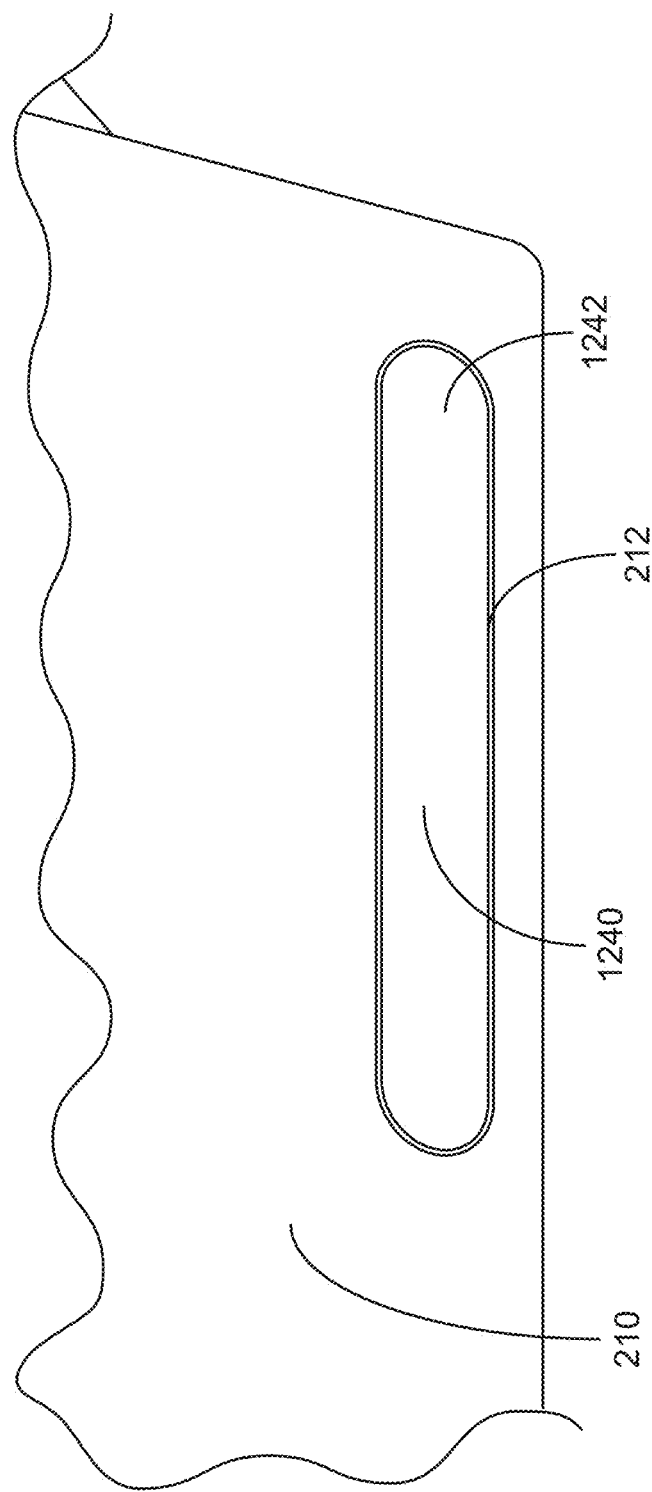
FIG. 13 illustrates a detailed view of a lever for an ejection mechanism according to an embodiment of the present invention.

FIG. 13 illustrates a detailed view of a lever for an ejection mechanism according to an embodiment of the present invention. Again, lever 1240 can be located in opening 212 of enclosure 210. It can be desirable that lever 1240 be stable in this position to prevent lever 1240 from inadvertently extending from enclosure 210 and becoming snagged on equipment or clothing (not shown.) Lever 1240 can include location 1242. Location 1242 can be identified by a raised or depressed surface, by a symbol, or can be identified in other ways. Again, a user can eject or begin an ejection process by pushing on location 1242 of lever 1240.

Figure 14:
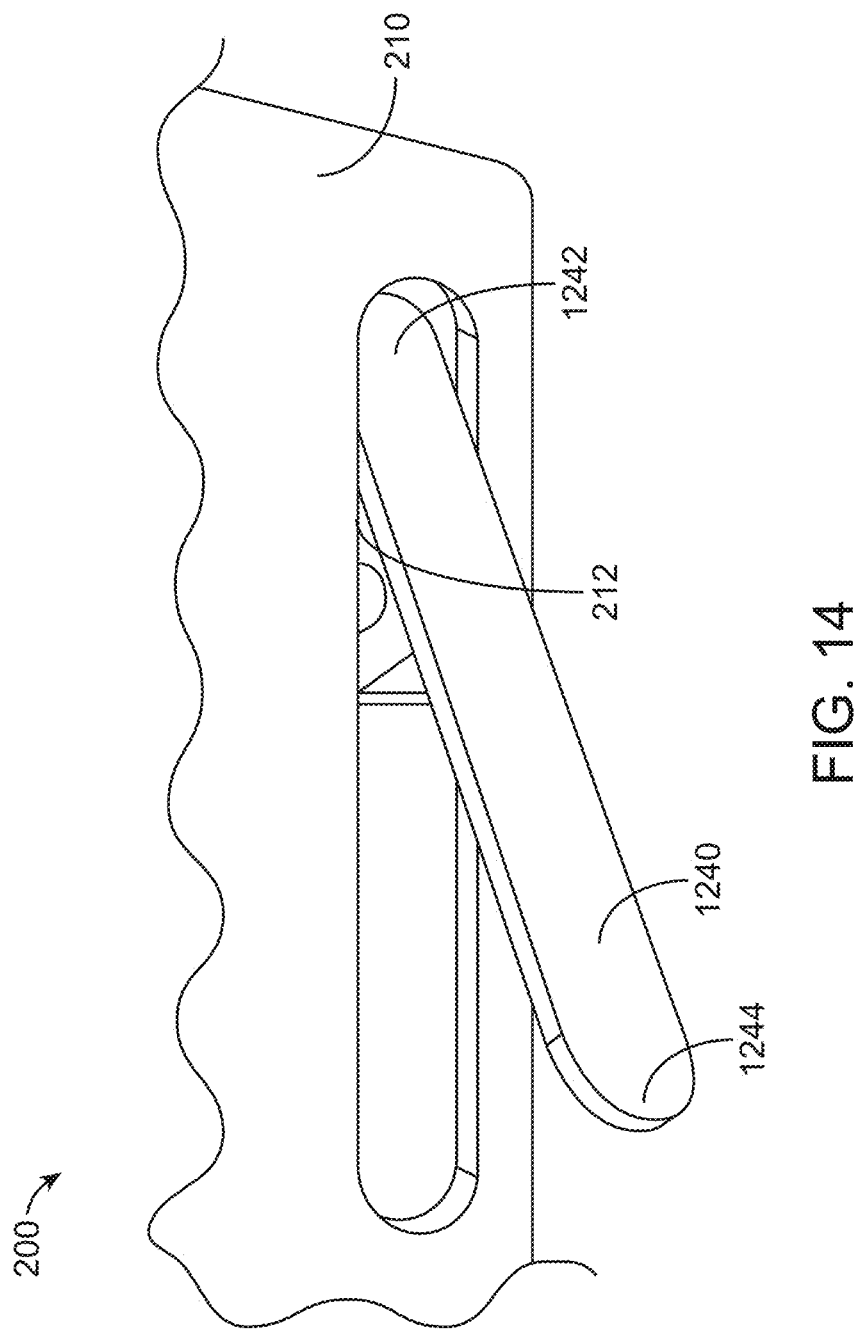
FIG. 14 illustrates another detailed view of a lever for an ejection mechanism according to an embodiment of the present invention.

FIG. 14 illustrates another detailed view of a lever for an ejection mechanism according to an embodiment of the present invention. In this view, location 1242 of lever 1240 has been pushed through opening 212 to the inside of enclosure 210. This can have the effect of moving end 1244 away from enclosure 210. This action can eject or begin the ejection of high-capacity computer module 200.

In these and other embodiments of the present invention, the ejection of high-capacity computer module 200 can be accomplished by a user pulling end 1244 further away from enclosure 210. To facilitate this action, it can be desirable for lever 1240 to be stable in the partially open position as shown, where end 1244 is some distance from enclosure 210. For example, this can help to prevent lever 1240 from inadvertently falling or moving back to the closed position as shown in FIG. 13. Again, it can also be desirable for lever 1240 be stable once it is in the closed position of FIG. 13. Accordingly, these and other embodiments of the present invention can provide a bi-stable lever. An example is shown in the following figures.

Figure 15:
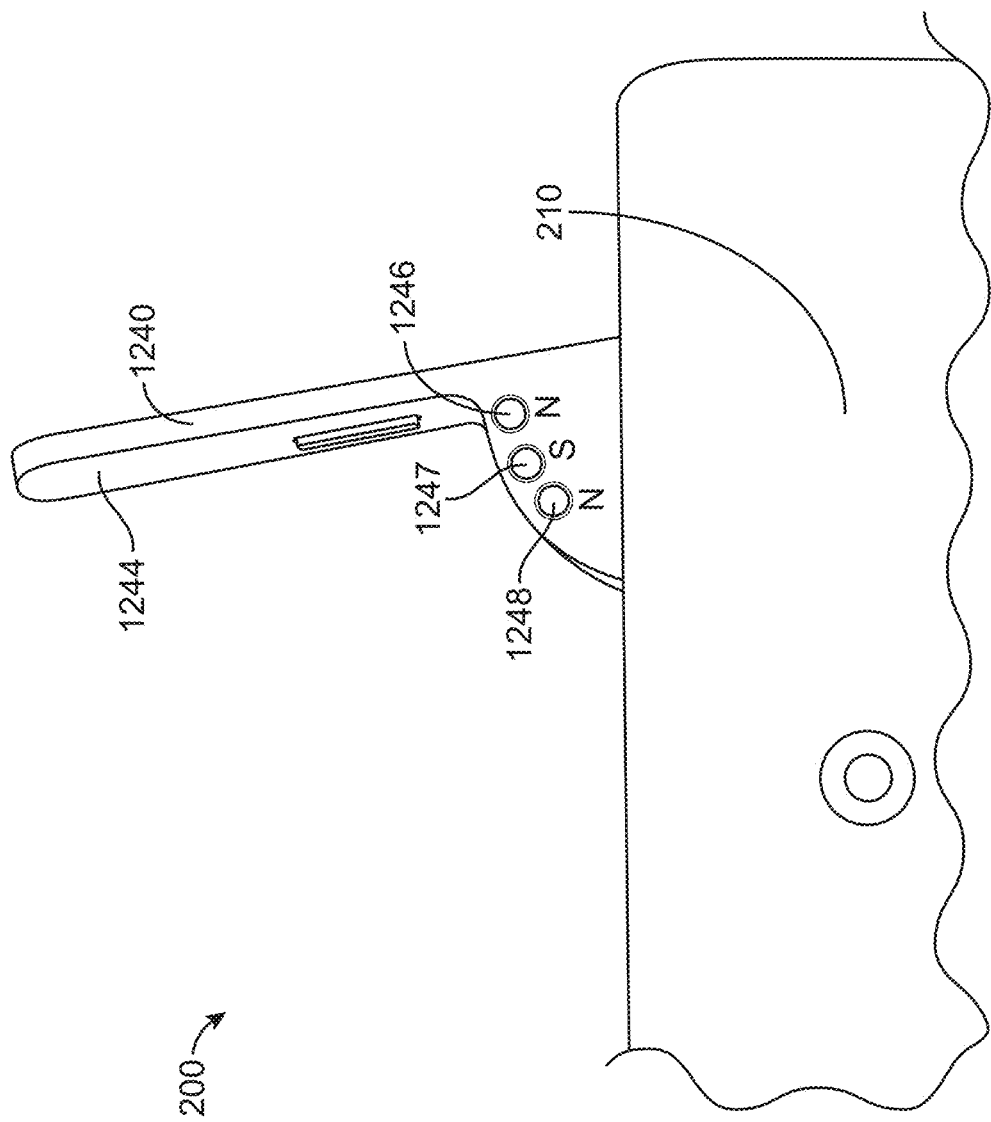
FIG. 15 illustrates a bi-stable lever according to an embodiment of the present invention.

FIG. 15 illustrates a bi-stable lever according to an embodiment of the present invention. In this example, end 1244 of lever 1240 has been moved away from enclosure 210 by a user. When lever 1240 is in this position, card edges 230 and 240 of board 220 (shown in FIG. 4) of high-capacity computer module 200 can be ejected from their sockets 530 and 540 (shown in FIG. 7.)

Lever 1240 can include a number of magnets 1246, 1247, and 1248. Magnets 1246 and 1248 can have a first polarity, such as a north polarity, while magnet 1247 can have a second polarity, such as a south polarity. These magnets can be attracted to or repelled from magnet 1630 in device enclosure 210 (shown in FIG. 16.) When the magnets are attracted, lever 1240 can be in a stable position. When the magnets are repelled, lever 1240 can be in an unstable position and can be magnetically driven to one of the two stable positions. The stable positions again can correspond to the closed position in FIG. 13 and the partially open position as shown in FIG. 14.

Figure 16:
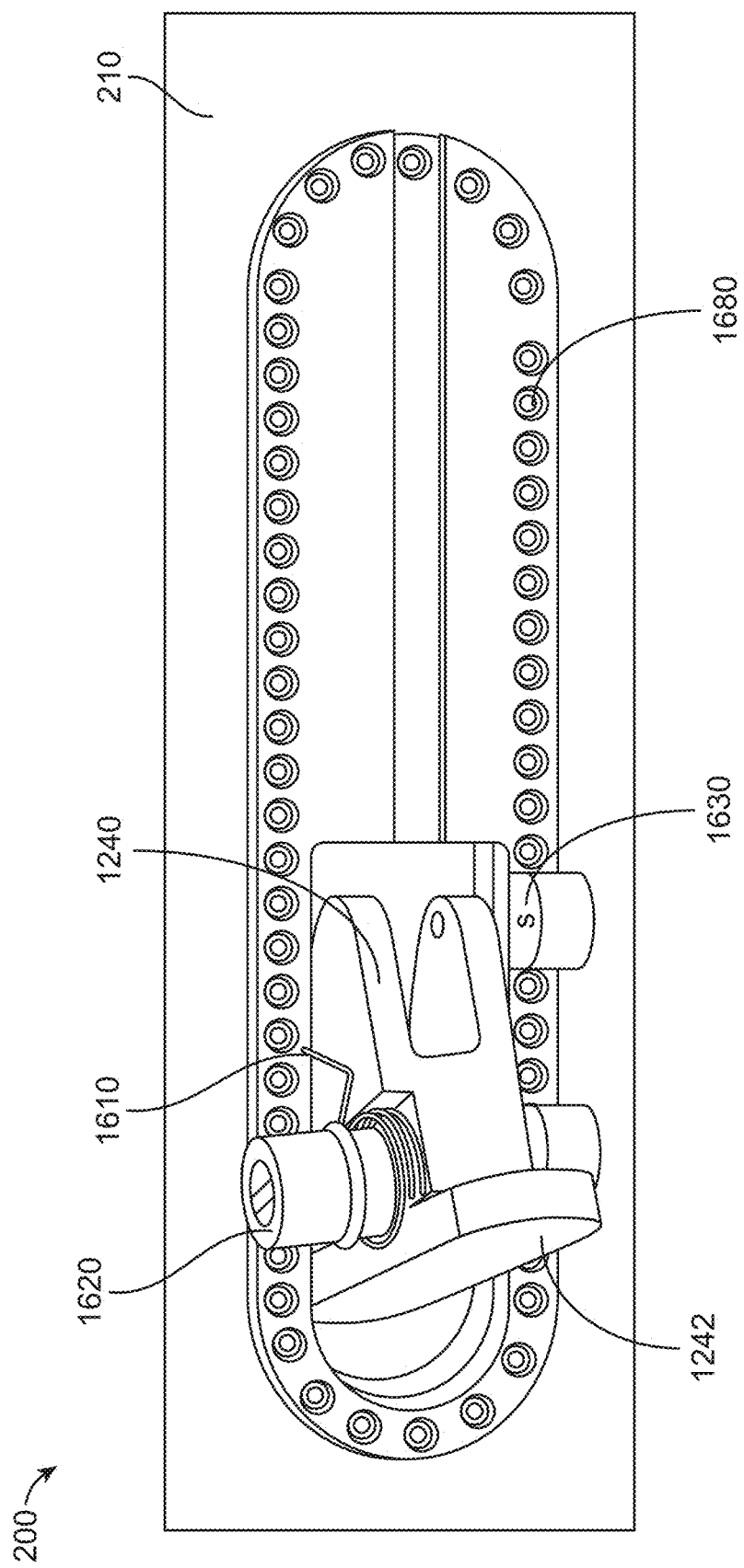
FIG. 16 illustrates further details of the lever of FIG. 15.

FIG. 16 illustrates further details of the lever of FIG. 15. Lever 1240 can be housed in bracket 1680, which can be attached to enclosure 210. Lever 1240 can include magnets 1246, 1247, 1248, as shown in FIG. 15. These magnets can be attracted to or repelled by magnet 1630 of bracket 1680 on an inside surface of enclosure 210. When magnet 1246 (shown in FIG. 15) and magnet 1630 are aligned, lever 1240 can be in a stable and closed position. When magnet 1248 (shown in FIG. 15) and magnet 1630 are aligned, lever 1240 can be in a stable and partially opened position. When magnet 1247 (shown in FIG. 15) and magnet 1630 are aligned, lever 1240 might not be stable and can move to one of the two stable positions.

Lever 1240 can be moved from its closed position as shown in FIG. 13 by a user pushing on location 1242 as described above. This can move the lever to the partially open position as shown in FIG. 14. To facilitate this action, lever 1240 can rotate about axis 1620. As a user further moves end 1244 away from enclosure 210 into the fully opened position shown in FIG. 15 to eject high-capacity computer module 200, spring 1610 can tighten. When a user releases end 1244 from its position shown in FIG. 15, spring 1610 can drive lever 1240 back to its closed position as shown in FIG. 13. Specifically, spring 1610 can provide enough force to drive lever 1240 through the partially open stable position of FIG. 14 to the closed position of FIG. 13.

Lever 1240 can be a fulcrum to provide force for an ejection mechanism for high-capacity computer module 200. The structures by which this force is translated can be implemented in different ways in different embodiments of the present invention. Examples are shown in the following figures.

Figure 17:
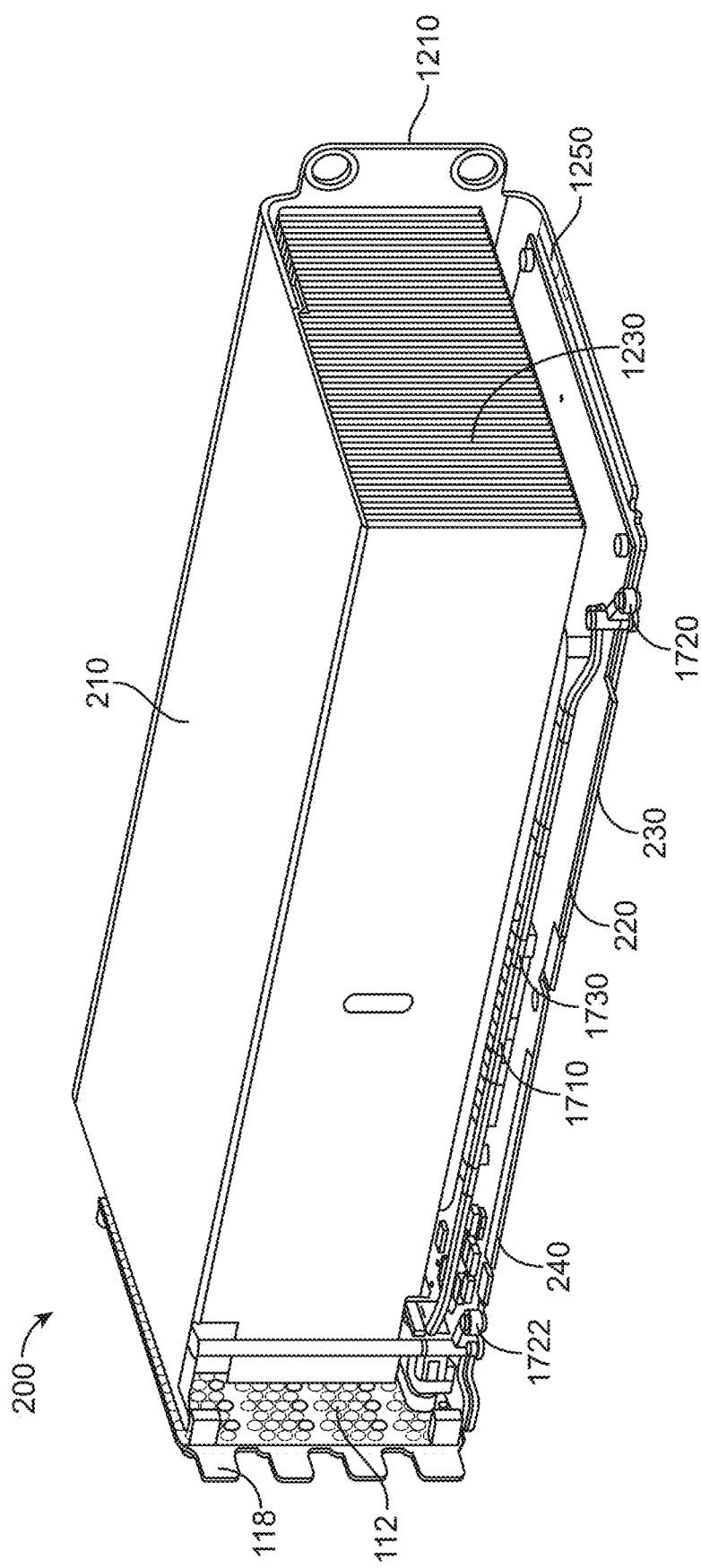
FIG. 17 is another view of a high-capacity computer module according to an embodiment of the present invention.

FIG. 17 is another view of a high-capacity computer module according to an embodiment of the present invention. High-capacity computer module 200 can be housed in enclosure 210. Enclosure 210 can include fins 1230 defining openings in a back of enclosure 210. Fans 520 (shown in FIG. 5) can drive air through fins 1230 and out enclosure wall 112. That is, fins 1230 can provide ducting to guide an air flow through device enclosure 210 of computer module 200. Tabs 118 of enclosure wall 112 and tab 1210 of enclosure 210 can assist a user in inserting high-capacity computer module 200 in a computer system enclosure 116 (shown in FIG. 1.) Again, tabs 118 can fit in slots (not shown) in computer system enclosure 116. Also, the presence of card edges 230 and 240 can limit the positions in computer system enclosure 116 where computer module 200 can be inserted. Accordingly, one or more tabs 118 can be sized differently (for example made larger) to fit with a corresponding feature of computer system enclosure 116. For example, one or more tabs 118 can be made larger such that they fit in larger slots in computer system enclosure 116, where the larger slots are appropriately positioned. This can prevent computer module 200 from being inserted into an incompatible location in computer system enclosure 116. Tab 1210 can be inserted into slot 2830 (shown in FIG. 28) in computer system enclosure 116 to align and stabilize high-capacity computer module 200 during insertion. Once inserted, card edges 230 and 240 of board 220 can be located in sockets 530 and 540, as shown in FIG. 7. During ejection, end 1244 can be pulled away from enclosure 210, as shown in FIG. 15. This action can translate to rod 1710, which can move such that wheels 1720 and 1722 push on main-logic board 700 or portions of sockets 530 and 540, thereby pushing card edges 230 and 240 of high-capacity computer module 200 out of their corresponding sockets 530 and 540. Wheels 1720 and 1722 can be actual wheels, or they can be other low-friction surfaces or sliding members (sliders) that can provide a low friction when high-capacity computer module 200 is being ejected. Rod 1710 can be grounded by ground springs 1730.

Figure 18:
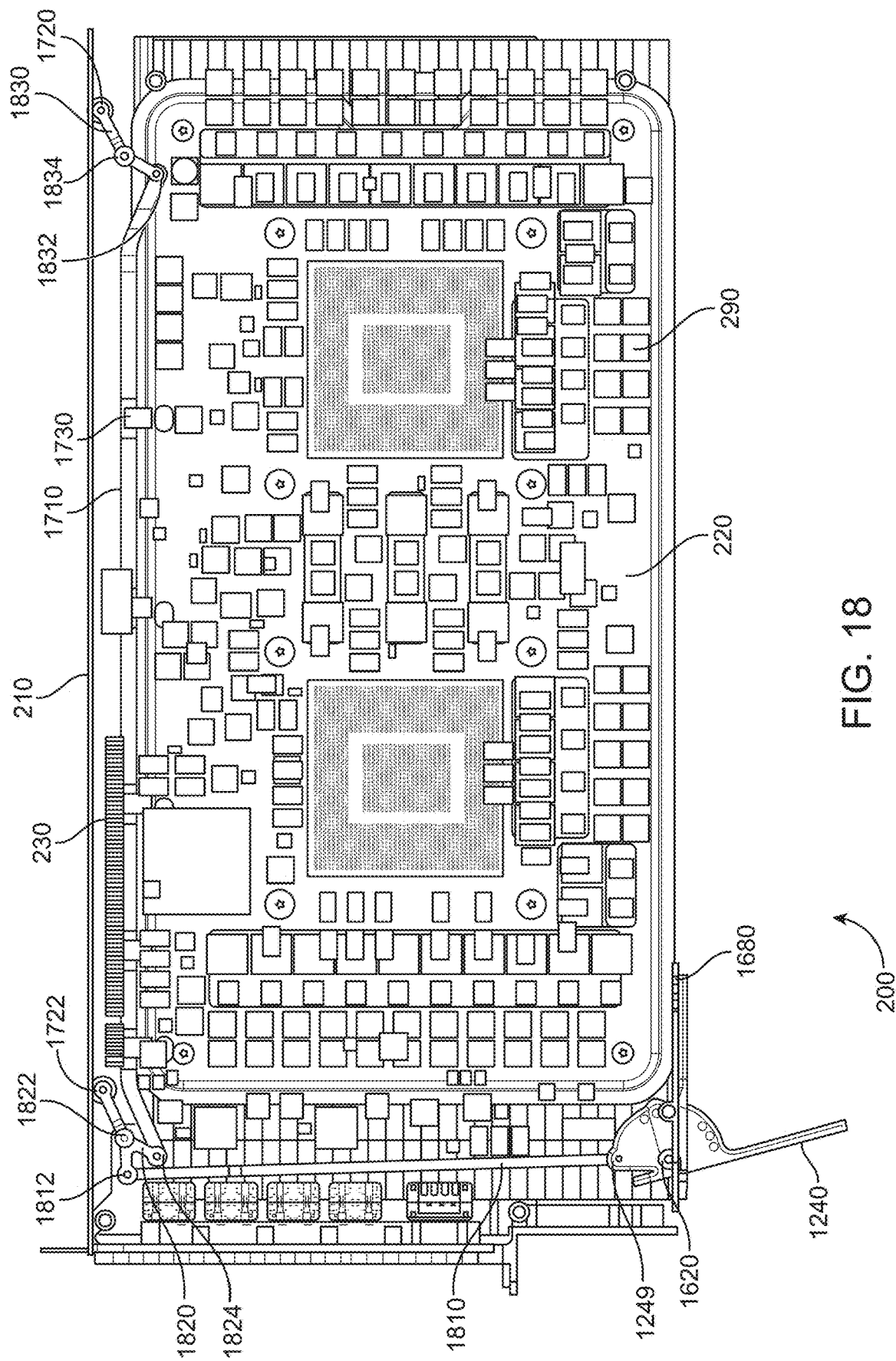
FIG. 18 illustrates a cutaway top view of an ejection mechanism for a high-capacity computer module according to an embodiment of the present invention.

FIG. 18 illustrates a cutaway top view of an ejection mechanism for a high-capacity computer module according to an embodiment of the present invention. Lever 1240 can be located in opening 212 (shown in FIG. 13) of bracket 1680 of enclosure 210 of high-capacity computer module 200. Lever 1240 can rotate about axis 1620. Lever 1240 can connect to rod 1810 at point 1249 and rod 1810 can connect to joining piece 1820 at point 1812. A clockwise rotation of lever 1240 can pull rod 1810 downward as shown, thereby rotating joining piece 1820 counterclockwise about axis 1822. The counterclockwise rotation of joining piece 1820 can drive wheel 1722 out of enclosure 210 where it can encounter main-logic board 500 or portions of socket 530 (shown in FIG. 7.) Joining piece 1820 can be connected to rod 1710 at point 1824. Rod 1710 can further be connected to joining piece 1830 at point 1832. The counterclockwise rotation of joining piece 1820 can push rod 1710 to the right. This can cause joining piece 1830 to rotate about axis 1834. The counterclockwise rotation of joining piece 1830 can drive wheel 1720 out of enclosure 210, where it can encounter main-logic board 500 or portions of socket 540, if present (shown in FIG. 7.) The action of wheels 1720 and 1722 encountering main-logic board 500 or portions of sockets 530 or 540 can push card edges 230 and 240 (shown in FIG. 4) of board 220 out of sockets 530 and 540, thereby ejecting high-capacity computer module 200.

After ejection, a user can release end 1244 of lever 1240. Spring 1610 (shown in FIG. 16) can drive lever 1240 in the counterclockwise direction to the closed position of FIG. 13. This can act on rod 1810 to turn joining piece 1820 in a clockwise direction, thereby retracting wheel 1722 into enclosure 210. This clockwise motion can pull on joining piece 1830, also turning it in a clockwise direction, thereby retracting wheel 1720 into enclosure 210. Board 220 can support various circuits 290.

Again, a user can remove high-capacity computer module 200 from sockets 530 or 540 of main-logic board 500 (all shown in FIG. 7) by rotating lever 1240 in a clockwise direction. This can pull rod 1810 downward as shown, thereby rotating joining piece 1820 counterclockwise. This action can provide compression on rod 1710, pushing rod 1710 to the right. These actions can move wheels 1722 and 1720 out of enclosure 210 where they can engage main-logic board 500, either directly or through sockets 530 or 540. But under some circumstances, card edges 230 and 240 (shown in FIG. 4) can require a high level of force to be ejected from sockets 530 or 540. Unfortunately, supplying this force with wheels 1722 and 1720 could be sufficient to damage one or more of logic board 500 or sockets 530 or 540.

To prevent this damage, rod 1810 can be formed of a plastic or other material that can act as a mechanical fuse. That is, rod 1810 can be designed such that it breaks and disables the movement of wheels 1722 and 1720 before damage can occur to logic board 500 or sockets 530 or 540. It should be noted that high-capacity computer module 200 can still be removed from sockets 530 or 540 on board 500 and that electrical functionality of high-capacity computer module 200 might not be impaired by the breaking of rod 1810.

Figure 19:
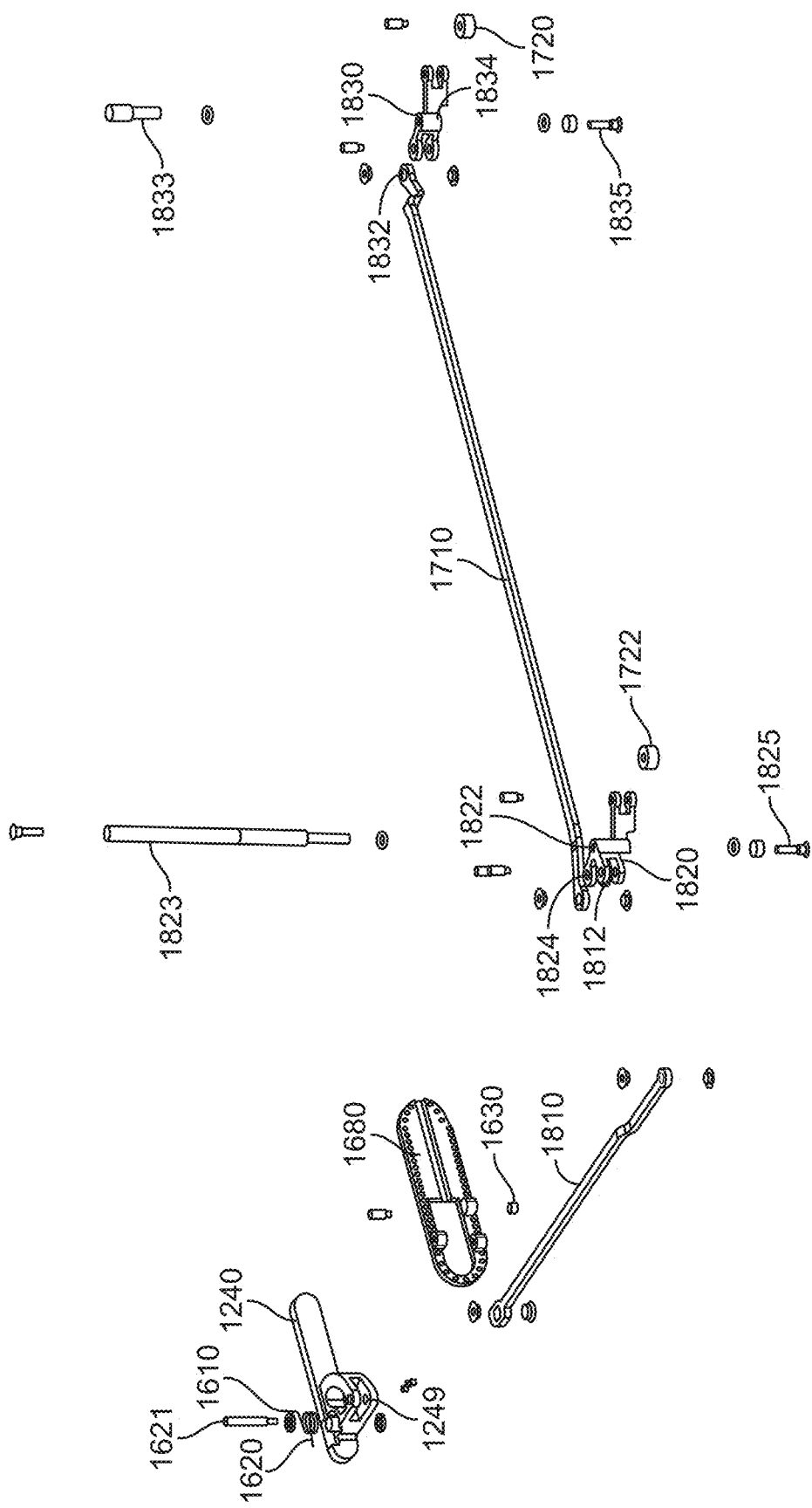
FIG. 19 is an exploded view of an ejection mechanism according to an embodiment of the present invention.

FIG. 19 is an exploded view of an ejection mechanism according to an embodiment of the present invention. Lever 1240 can be supported by bracket 1680. Bracket 1680 can further support magnet 1630. Lever 1240 can rotate about axis 1620 and be held in place by fastener 1621. Lever 1240 can attach to rod 1810 at point 1249 and rod 1810 can attach to joining piece 1820 at point 1812. Joining piece 1820 can be held in place at axis 1822 by fasteners 1823 and 1825, which can extend through all or some of enclosure 210 (shown in FIG. 12.) Joining piece 1820 can also attached to wheel 1722. Joining piece 1820 can attach to rod 1710 at point 1824. Rod 1710 can further attach to joining piece 1830 at point 1832. Joining piece 1830 can be attached to wheel 1720 and can be in place by fasteners 1833 and 1835 at axis 1834.

This ejection mechanism, and the other ejection mechanisms herein and in these and other embodiments of the present invention, can have a low-profile. This low-profile allows air flow through high-capacity computer module 200 (shown in FIG. 12), thereby improving device performance.

Figure 20:
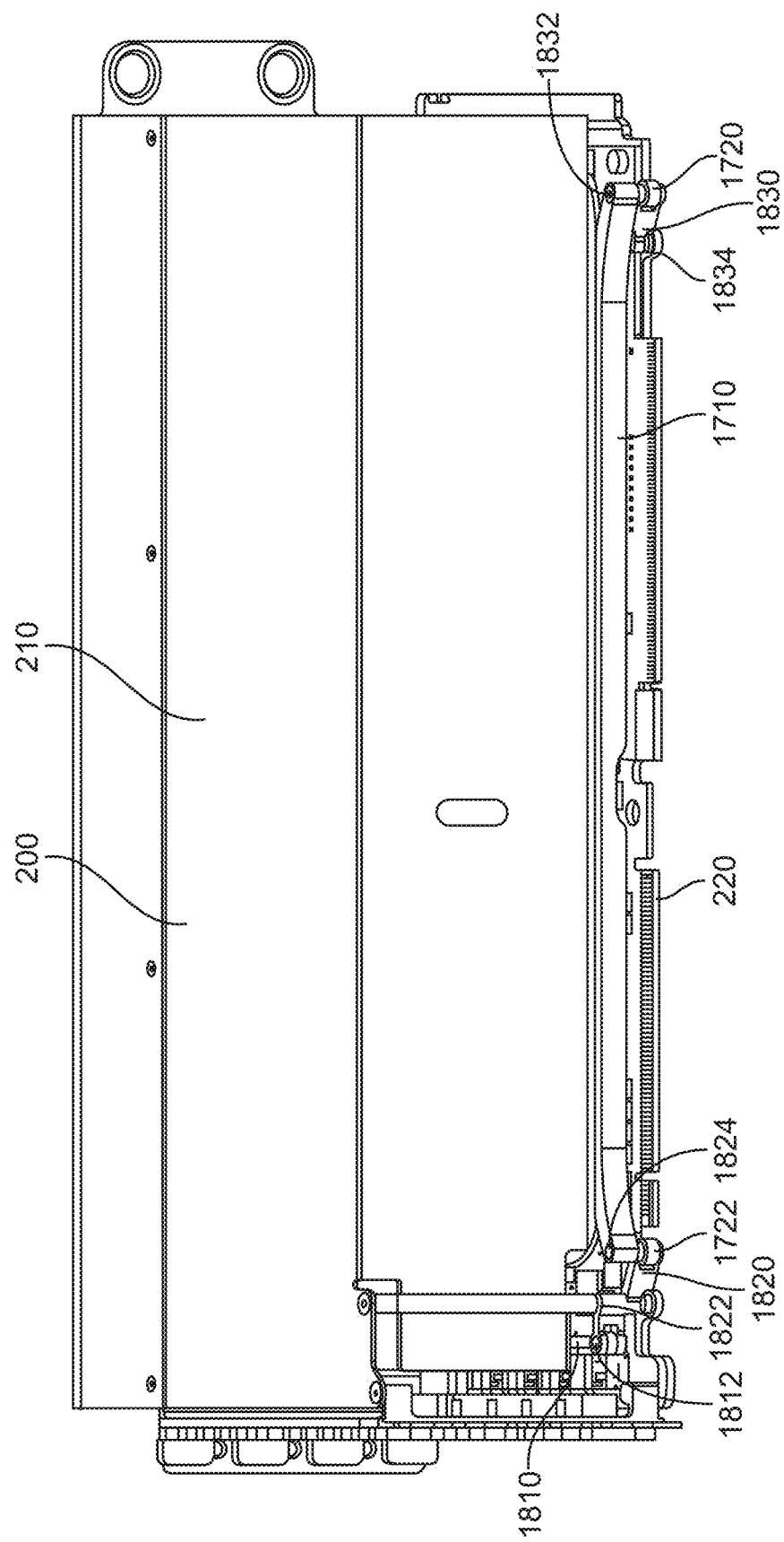
FIG. 20 illustrates an ejection mechanism for a high-capacity computer module according to an embodiment of the present invention.

FIG. 20 illustrates an ejection mechanism for a high-capacity computer module according to an embodiment of the present invention. High-capacity computer module 200 can include lever 1240 (shown in FIG. 18) can rotate about axis 1620 (shown in FIG. 18.) Lever 1240 can connect to rod 1810 at point 1249 (shown in FIG. 18) and rod 1810 can connect to joining piece 1820 at point 1812. A counterclockwise rotation of lever 1240 can pull rod 1810 upwards as shown, thereby rotating joining piece 1820 clockwise about axis 1822. The clockwise rotation of joining piece 1820 can drive wheel 1722 out of enclosure 210 where it can encounter main-logic board 500 or portions of socket 530 (shown in FIG. 7.) Joining piece 1820 can be connected to rod 1710 at point 1824. Rod 1710 can further be connected to joining piece 1830 at point 1832. The clockwise rotation of joining piece 1820 can pull rod 1710 to the left as shown. This can cause joining piece 1830 to rotate about axis 1834. The clockwise rotation of joining piece 1830 can drive wheel 1720 out of enclosure 210, where it can encounter main-logic board 500 or portions of socket 540, if present (shown in FIG. 7.) The action of wheels 1720 and 1722 encountering main-logic board 500 or portions of sockets 530 or 540 can push card edges 230 and 240 (shown in FIG. 4) of board 220 out of sockets 530 and 540, thereby ejecting high-capacity computer module 200.

After ejection, a user can release end 1244 (shown in FIG. 18) of lever 1240. Spring 1610 (shown in FIG. 16) can drive lever 1240 in the clockwise direction to the closed position of FIG. 13. This can act on rod 1810 to turn joining piece 1820 in a counterclockwise direction, thereby retracting wheel 1722 into enclosure 210. This clockwise motion can pull on joining piece 1830, turning it in a counterclockwise direction, thereby retracting wheel 1720 into enclosure 210. Board 220 can support various circuits 290.

The ejection mechanism of FIG. 20 can provide various advantages. For example, during ejection, rod 1710 is under tension, not compression, as is the case in FIG. 18. This allows rod 1710 to be formed of plastic instead of metal, again, as is the case in FIG. 18. This can reduce signal coupling among contacts 232 and 242 (shown in FIG. 4) on board 220 and reduce or eliminate the need for ground springs 1730 as shown in FIG. 17.

FIG. 21 is another view of the ejection mechanism for a high-capacity computer module of FIG. 20. Lever 1240 can be located in opening 212 (shown in FIG. 13) of bracket 1680 of enclosure 210 of high-capacity computer module 200. Lever 1240 can rotate about axis 1620. Specifically, lever 1240 can be in a stable closed position 1240A. It can then be moved to a stable opened position 1240B. High-capacity computer module can then be ejected by moving lever 1240 to position 1240C. Lever 1240 can have a soft or pliable material 1241 on a rear surface to make it graspable by a user and to reduce noise or act as an acoustic damper when lever 1240 is in the closed position 1240A.

Lever 1240 can connect to rod 1810 at point 1249 and rod 1810 can connect to joining piece 1820 at point 1812. A clockwise rotation of lever 1240 can pull rod 1810 upward as shown, thereby rotating joining piece 1820 counterclockwise about axis 1822. The counterclockwise rotation of joining piece 1820 can pull wheel 1722 out of enclosure 210 where it can encounter main-logic board 500 or portions of socket 530 (shown in FIG. 7.) Joining piece 1820 can be connected to rod 1710 at point 1824. Rod 1710 can further be connected to joining piece 1830 at point 1832. The counterclockwise rotation of joining piece 1820 can pull rod 1710 to the right. This can cause joining piece 1830 to rotate about axis 1834. The counterclockwise rotation of joining piece 1830 can drive wheel 1720 out of enclosure 210, where it can encounter main-logic board 500 or portions of socket 540, if present (shown in FIG. 7.) The action of wheels 1720 and 1722 encountering main-logic board 500 or portions of sockets 530 or 540 can push card edges 230 and 240 (shown in FIG. 4) of board 220 out of sockets 530 and 540, thereby ejecting high-capacity computer module 200.

After ejection, a user can release end 1244 of lever 1240. Spring 1610 (shown in FIG. 16) can drive lever 1240 in the counterclockwise direction to the closed position of FIG. 13. This can act on rod 1810 to turn joining piece 1820 in a clockwise direction, thereby retracting wheel 1722 into enclosure 210. This clockwise motion can pull on joining piece 1830, also turning it in a clockwise direction, thereby retracting wheel 1720 into enclosure 210. Board 220 can support various circuits 290.

Again, a user can remove high-capacity computer module 200 from sockets 530 or 540 of main-logic board 500 (all shown in FIG. 7) by rotating lever 1240 in a clockwise direction as shown. This can pull rod 1810 upward as shown, thereby rotating joining piece 1820 counterclockwise. This action can provide tension on rod 1710, thereby pulling rod 1710 to the right. These actions can move wheels 1722 and 1720 out of enclosure 210 where they engage main-logic board 500, either directly or through sockets 530 or 540. But under some circumstances, card edges 230 and 240 (shown in FIG. 4) can require a high level of force to be ejected from sockets 530 or 540. Unfortunately, supplying this force with wheels 1722 and 1720 could be sufficient to damage one or more of logic board 500 or sockets 530 or 540.

To prevent this damage, rod 1810 can be formed of a plastic or other material that can act as a mechanical fuse. That is, rod 1810 can be designed such that it breaks and disables the movement of wheels 1722 and 1720 before damage can occur to logic board 500 or sockets 530 or 540. It should be noted that high-capacity computer module 200 can still be removed from sockets 530 or 540 on board 500 and that electrical functionality of high-capacity computer module 200 might not be impaired by the breaking of rod 1810.

In these and other embodiments of the present invention, it can be desirable for card edges 230 and 240 of board 220 (shown in FIG. 4) of high-capacity computer module 200 (shown in FIG. 12) to be held in sockets 530 and 540 (shown in FIG. 7) in a secure manner. Accordingly, embodiments of the present invention can provide a latching mechanism that drives card edges 230 and 240 of board 220 into sockets 530 and 540. An example is shown in the following figures.

FIG. 22 illustrates a latching mechanism to secure a high-capacity computer module in place according to an embodiment of the present invention. In this example, board 220 can include tab 226. Tab 226 can be defined by slotted passage 224. Latching mechanism 2010 can include tab 2012 that can engage tab 226. Latching mechanism 2010 can rotate about axis 2014. When latching mechanism 2010 is rotated in a counterclockwise manner, tab 2012 can engage tab 226, thereby pushing board 220 into sockets 530 and 540 (shown in FIG. 7.) This can provide a seating force pushing card edges 230 and 240 into sockets 530 and 540. When latching mechanism 2010 is rotated in a clockwise manner, tab 2012 can align with the vertical portion of slotted passage 224 to allow board 220 to be removed from sockets 530 and 540.

Figure 23:
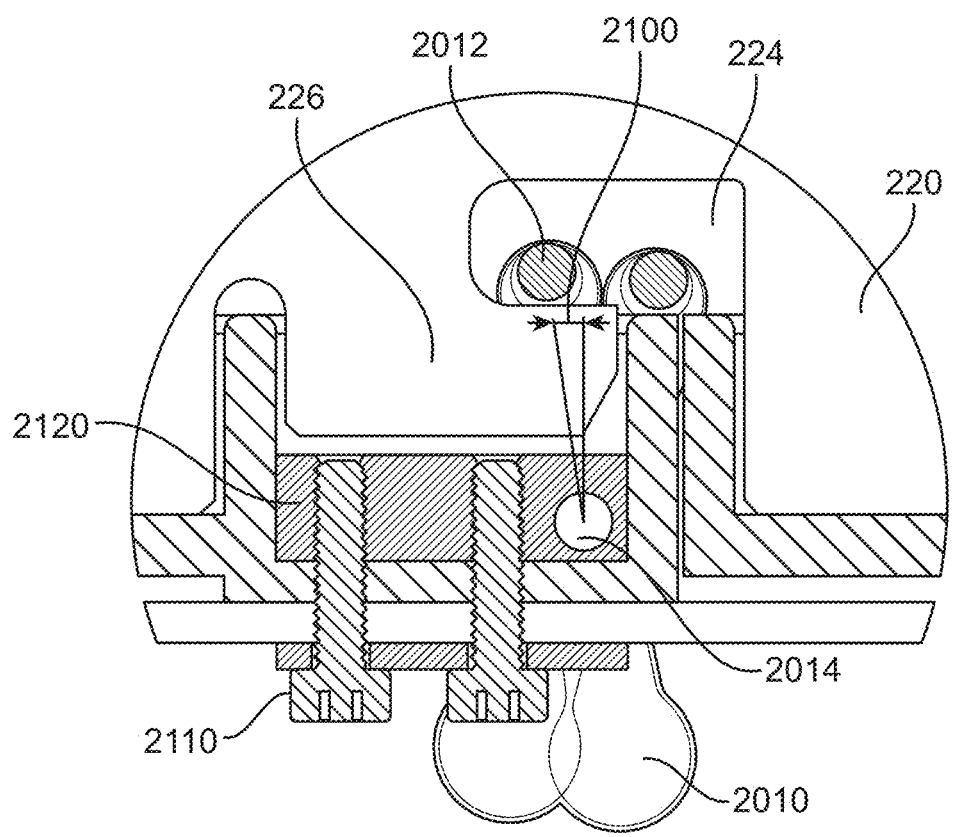
FIG. 23 illustrates further details of the latching mechanism of FIG. 22.

FIG. 23 illustrates further details of the latching mechanism of FIG. 22. Latching mechanism 2010 can include tab 2012, which can be located in slotted passage 224 in board 220. Slotted passage 224 can define tab 226, which can support tab 2012 when latching mechanism 2010 is in the latched position. Again, latching mechanism 2010 can rotate about axis 2014. Latching mechanism 2010 can rotate in the counterclockwise direction through an angle 2100 past vertical as shown. Rotating past this angle 2100 can help to ensure that latching mechanism 2010 remains in a latched position during device operation. In these and other embodiments of the present invention, this critical angle can be at least approximately 7.85 degrees, 8.35 degrees, 10 degrees, 11.5 degrees, 13 degrees, or other angle. Axis 2014 can formed together with, or separately from and then attached to, plate 2120, which can be held in place by one or more fasteners 2110.

Board 220 can be inserted when latching mechanism 2010 is in the clockwise-most position. In this position, tab 2012 can pass through the vertical portion of slotted passage 224.

To secure board 220 in place, latching mechanism 2010 can be driven counterclockwise such that tab 2012 engages tab 226. Latching mechanism 2010 can be held in place by a spring force provided by a spring or other mechanism (not shown.) The ejection mechanism shown above in FIGS. 12-19 can be used to rotate latching mechanism 2010 in a clockwise direction for the removal of board 220.

Figure 24:
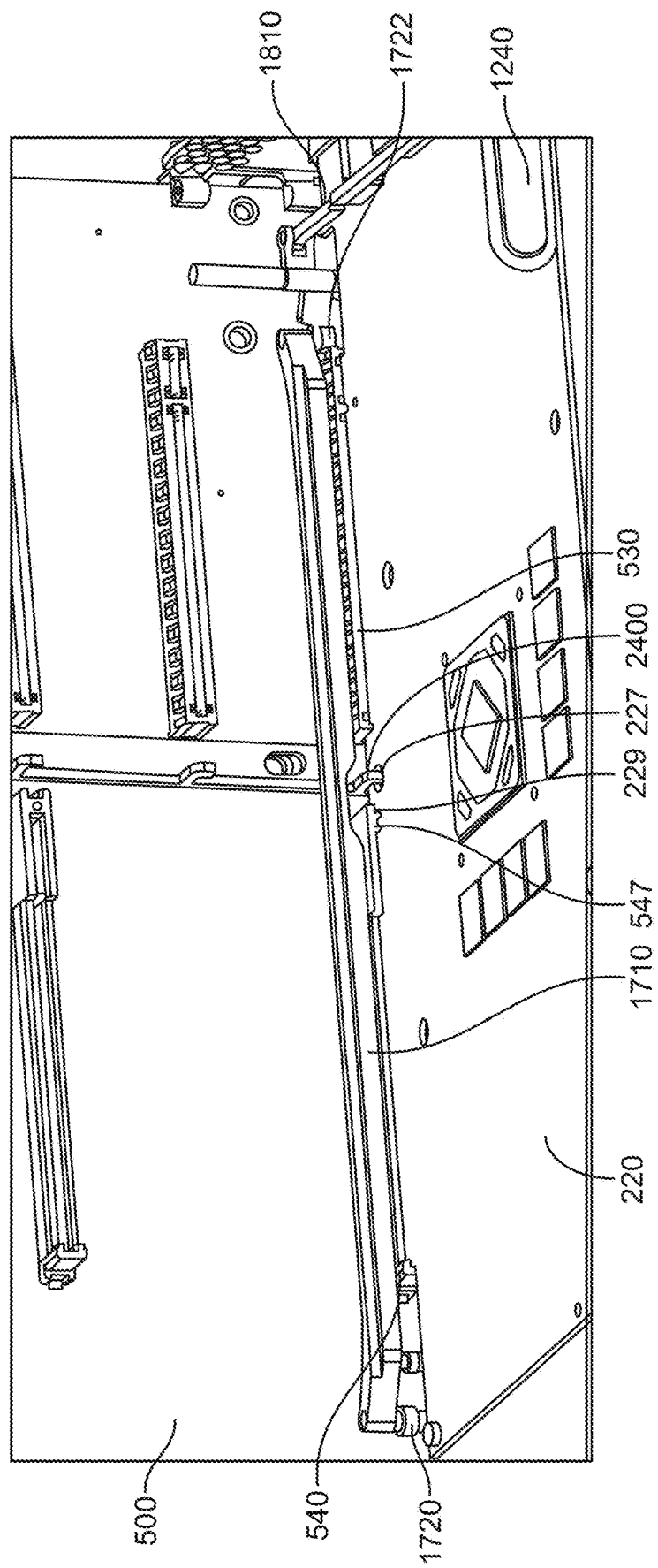
FIG. 24 illustrates a latching mechanism to secure a high-capacity computer module in place according to an embodiment of the present invention.

FIG. 24 illustrates a latching mechanism to secure a high-capacity computer module in place according to an embodiment of the present invention. In this example, hockey-stick shaped hook 2400 can fit in opening 227 of board 220 to secure board 220 in place in sockets 530 and 540. Hook 2400 can be moved up out of opening 227 to release board 220, and down to lock board 220 in place.

Rod 1710 of the ejection mechanism of FIGS. 20 and 21 is also shown. Lever 1240 can be actuated to move rod 1810 and rod 1710 in order to push wheels 1720 and 1722 against main-logic board 500 to eject board 220 or to lift wheels 1720 and 1722 off main-logic board 500 to allow board 220 to be seated in sockets 530 and 540.

The high-capacity computer module that houses board 220 can mechanically stress sockets 530 and 540. Accordingly, either or both of these sockets can be reinforced in various ways. For example, socket 540 can include a reinforcing structure such as pin 547. Pin 547 can provide reinforcement of a portion of socket 540. This portion can be somewhat large and can be accommodated for by the size of notch 229 on board 220.

Figure 25:
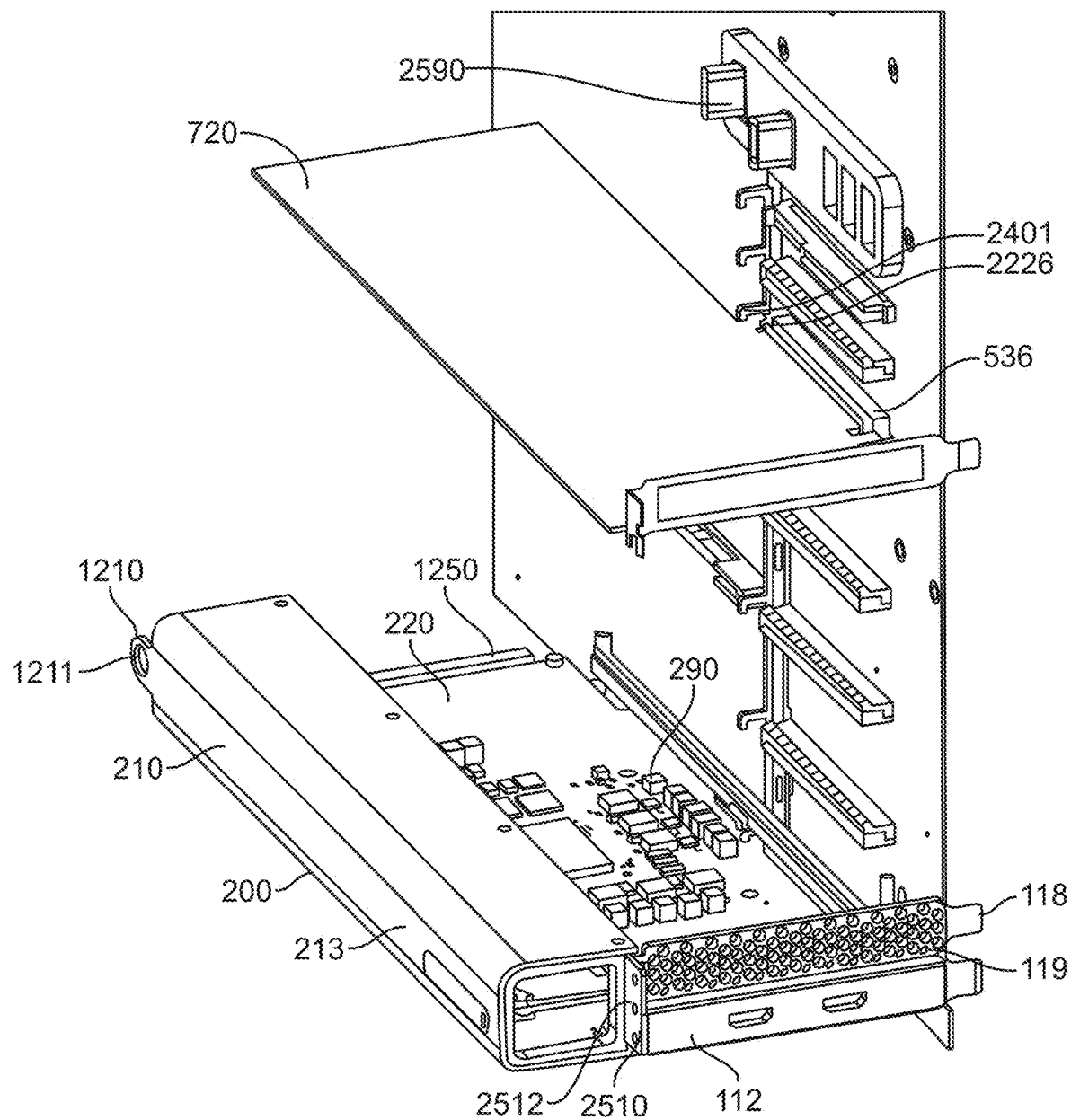
FIG. 25 illustrates a latching mechanism to secure a high-capacity computer module in place according to an embodiment of the present invention.

FIG. 25 illustrates a latching mechanism to secure a computer module in place according to an embodiment of the present invention. In this example, a conventional PCIe computer module, shown here as computer module 720, can be inserted into socket 536. Hook 2401, which can be substantially similar to hook 2400 above, can hold tab 2226, thereby securing computer module 720 in socket 536. Accordingly, hooks 2400 and 2401 can be used to secure either conventional or high-capacity computer modules in place in their corresponding sockets. Hooks 2400 and 2401 can be moved by sliding button 2590 from side to side. One example of a mechanism that can move hook 2400 is shown in FIG. 26 and FIG. 27.

Computer module 720 can be held in place using hook 2400 or 2401. These and other embodiments of the present invention can provide additional support structures for high-capacity computer module 200. For example, tabs 118 of enclosure wall 112 can be fit into slots (not shown) in computer system enclosure 116 (shown in FIG. 1.) Tab 1210 of enclosure 210 can be fit in a slot 2830 (shown in FIG. 28) in computer system enclosure 116 (shown in FIG. 1) to help mechanically support high-capacity computer module 200. A clamp screw 2822 (shown in FIG. 28) can be fit through opening 1211 in tab 1210 to secure tab 1210 in place in slot 2830. Tab 1250 of enclosure 210 can be fit in a slot 2840 (shown in FIG. 28) in computer system enclosure 116 to provide further support. Additionally, extended surface 2510 of enclosure wall 112 can include hole 2512, into which a fastener, such as thumbscrew 2812 (shown in FIG. 28) can be threaded. Additional support can be provided by groove 119 in enclosure wall 112, into which cross beam 2804 (shown in FIG. 28) can be fit during insertion of high-capacity computer module 200 into computer system enclosure 116. In this example, fin cover 2860 (shown in FIG. 28) has been removed exposing various circuits 290 on board 220. Board 220 can be placed on a top of back cover 213. Back cover 213 can wrap around a front side of computer module 200 as shown to form a portion of enclosure 210.

Figure 26:
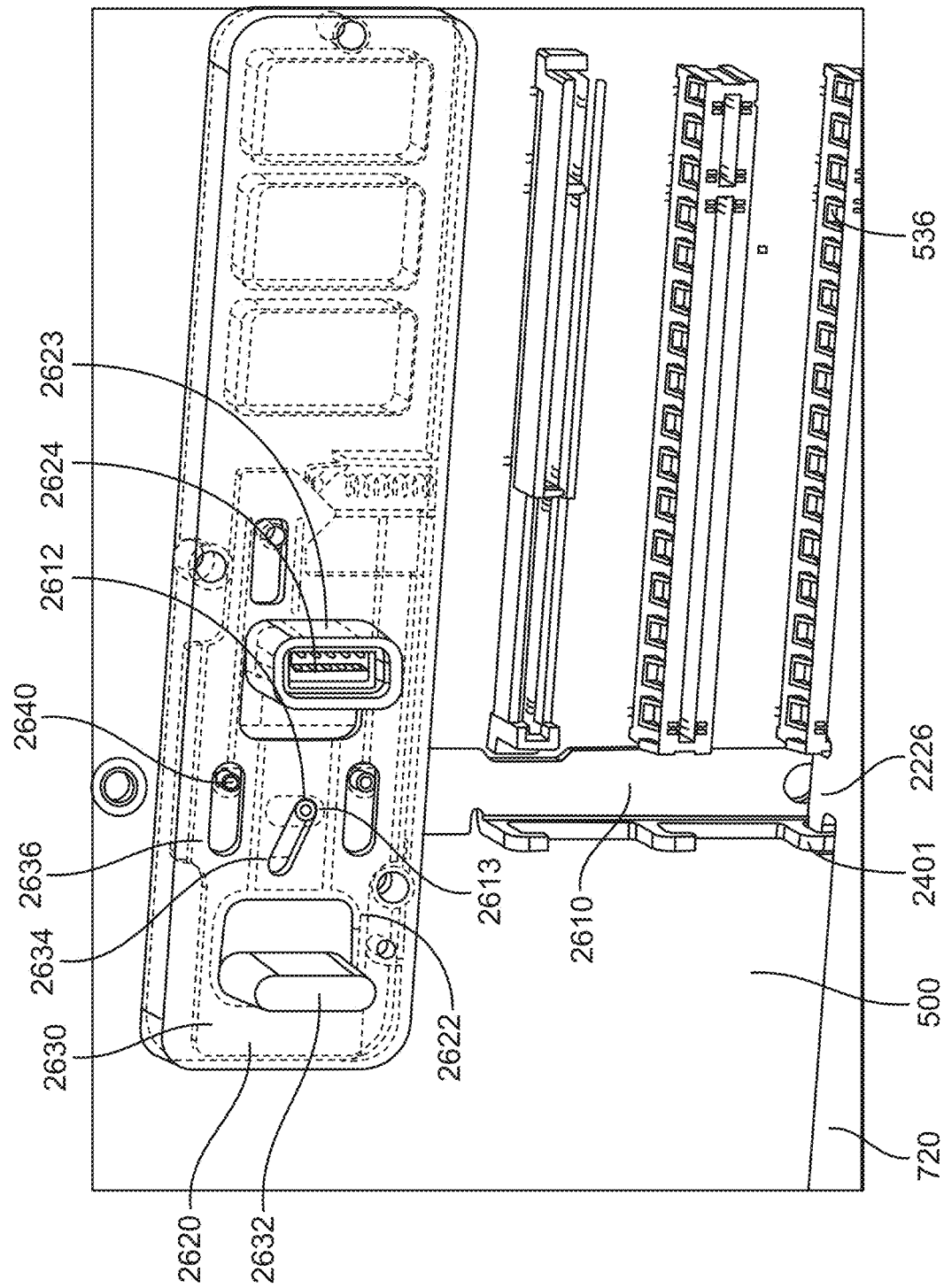
FIG. 26 illustrates a latching mechanism to secure computer modules in place in a computing device enclosure according to an embodiment of the present invention.
Figure 27:
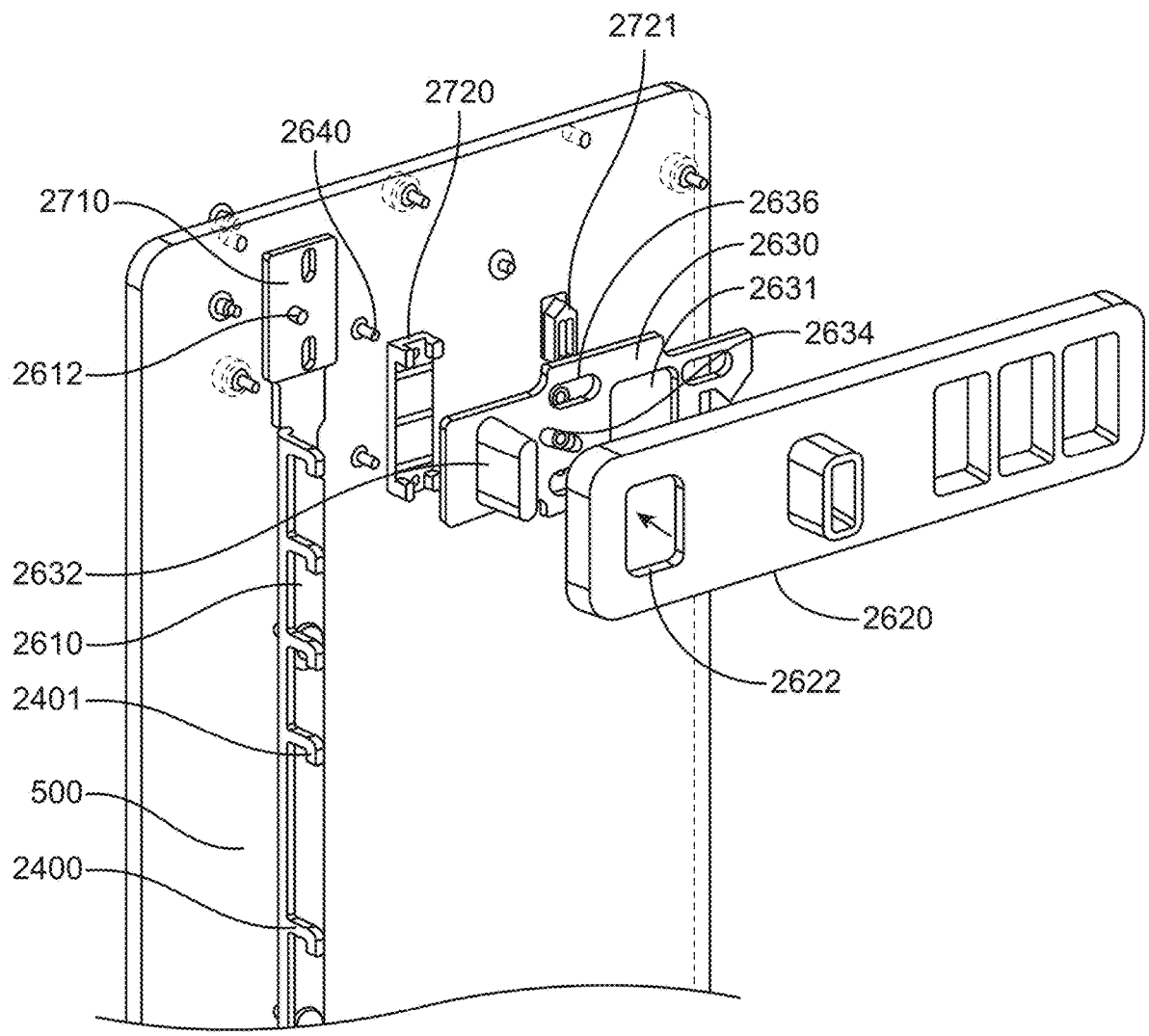
FIG. 27 illustrates a latching mechanism to secure computer modules in place in a computing device enclosure according to an embodiment of the present invention.

FIG. 26 illustrates a latching mechanism to secure computer modules in place in a computing device enclosure according to an embodiment of the present invention. This latching mechanism can secure computer modules, such as high-capacity computer modules 200 (shown in FIG. 2) as well as convention PCIe and other computer modules 720. Hooks 2400 (shown in FIG. 24) and 2401 can be moved by a user (not shown) to release or secure these computer modules. Hook rail 2610 can move up and down or vertically as shown when the user moves button 2632 in a side-to-side, lateral, or horizontal direction as shown, thereby moving hooks 2400 and 2401 into place to secure or release computer module 720. Cover 2620 can be attached to board 500, for example by using bracket 2720 and bracket 2721 (shown in FIG. 27.) Button 2632 can extend from sliding plate 2630, which can be captured between cover 2620 and board 500. Cover 2620 can include opening 2622 for button 2632 and housing 2623 for connector 2624.

Guide pins 2640 can be located in slots 2636 to guide sliding plate 2630 and button 2632 in a side-to-side direction. Hook rail pin 2612 can be captured in ramp slot 2634 in sliding plate 2630. As button 2632 and sliding plate 2630 are moved laterally or horizontally by a user, hook rail pin 2612 can move vertically in ramp slot 2634, thereby moving hook rail 2610 and hooks 2400 and 2401 vertically. For example, moving button 2632 to the left as shown can move ramp slot 2634 relative to hook rail pin 2612 such that hook rail 2610 and hook 2401 are lowered. This can engage hook 2401 with tab 2226 on computer module 720, thereby securing computer module 720 in place in socket 536. Ramp slot 2834 can have a detent 2613 corresponding to the engaged position for further security.

FIG. 27 illustrates a latching mechanism to secure computer modules in place in a computing device enclosure according to an embodiment of the present invention. Cover 2620 can be attached to board 500, for example by using bracket 2720 and bracket 2721. Button 2632 can extend from or otherwise be attached to sliding plate 2630, which can be captured between cover 2620 and board 500. Cover 2620 can include opening 2622 for button 3632 as well as connector housing 2623. Guide pins 2640 can be located in slots 2636 to guide sliding plate 2630 and button 2632 in a side-to-side direction. Hook rail pin 2612 can be captured in ramp slot 2634 in sliding plate 2630. Hooks 2400 and 2401 can extend from hook rail 2610. To facilitate vertical movement of hook rail 2610, a low-friction layer 2710 can be placed on hook rail 2610 between hook rail 2610 and sliding plate 2630. This low-friction layer can also cover hook rail pin 2612. A similar layer can be used between hook rail 2610 and board 500.

In various embodiments of the present invention, plastic components that come into contact with each other can cause noise. One such spot can be the interface between bracket 2721 and sliding plate 2630. That is, as sliding plate 2630 is moved back and forth, an edge of opening 2631 in sliding plate 2630 can encounter bracket 2721, and this can cause noise. To reduce this noise, a surface of bracket 2721 can be coarsened, for example by sandblasting, sanding, etching, or by using another technique. This abrasion can reduce noise that could otherwise be generated between bracket 2721 and sliding plate 2630. This abraded surface can also absorb small plastic shavings that could otherwise litter an inside of a computer housing supporting this latching mechanism. In these and other embodiments of the present invention, low-friction layer 2710 can be used to reduce noise in this and similar locations.

Figure 28:
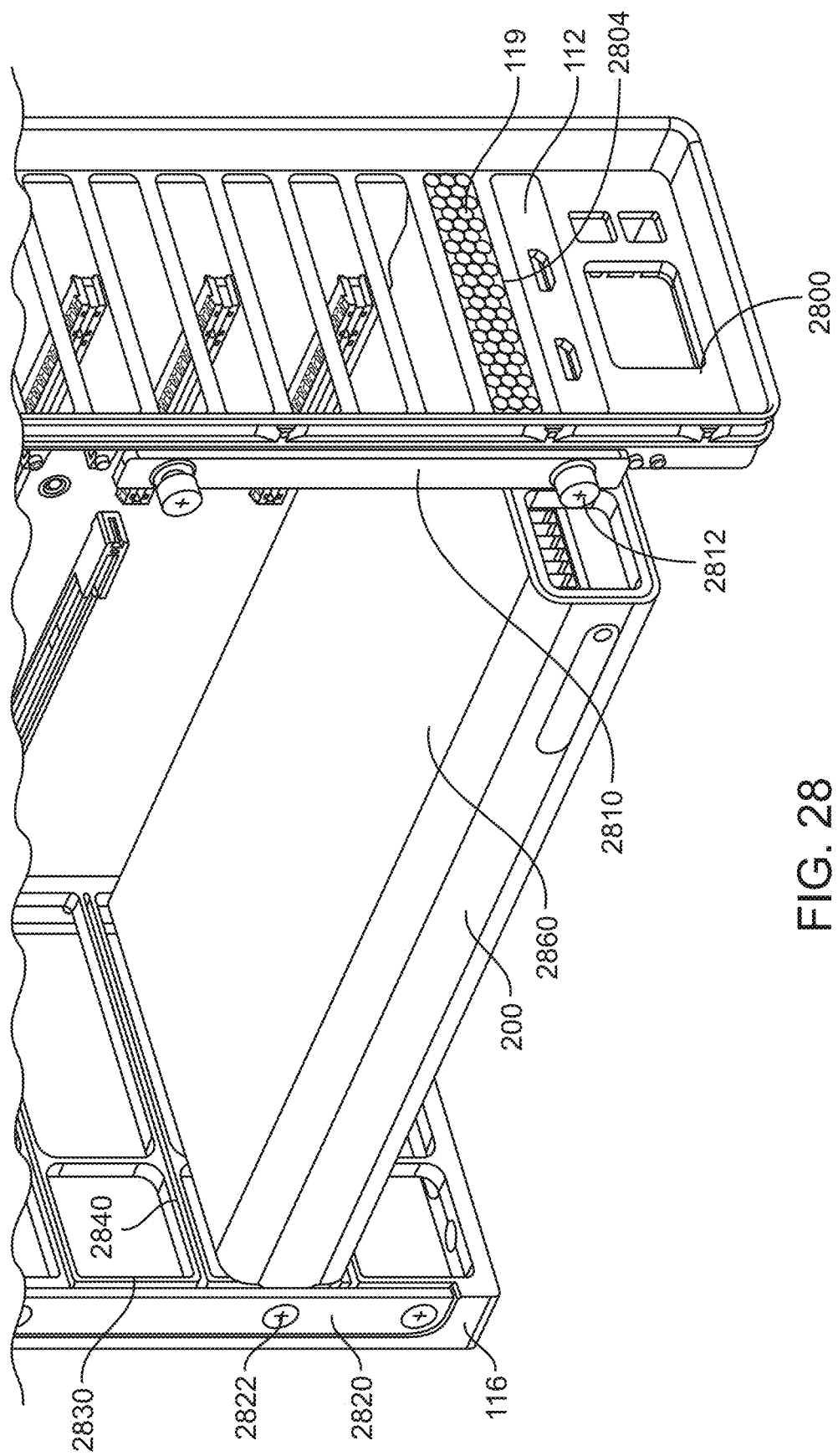
FIG. 28 illustrates a portion of a high-capacity computer module and a portion of a computer system according to an embodiment of the present invention.

FIG. 28 illustrates a portion of a high-capacity computer module and a portion of a computer system according to an embodiment of the present invention. Again, these and other embodiments of the present invention can provide additional support structures for high-capacity computer module 200. For example, tab 1210 (shown in FIG. 25) can be inserted in a slot 2830 of computer system enclosure 116. Clamp screw 2822 can be threaded or otherwise fit through plate 2820, slot 2830, and opening 1211 in tab 1210. Tab 1250 (shown in FIG. 25) can be fit into a slot 2840. A fastener, such as thumbscrew 2812, can be threaded or otherwise fit through plate 2810 and into hole 2512 of extended surface 2500 (shown in FIG. 25) of enclosure wall 112. Front grill 2800 can include cross beams 2804. A cross beam 2804 can be fit in groove 119 of enclosure wall 112 for additional support and stability. Fin cover 2860 is shown as being in place. Fin cover 2860 can include fins 1230 shown in FIG. 12. Fins 1230 can be soldered or otherwise thermally connected to various circuits 290 (shown in FIG. 25) on board 220 (shown in FIG. 25.)

Figure 29:
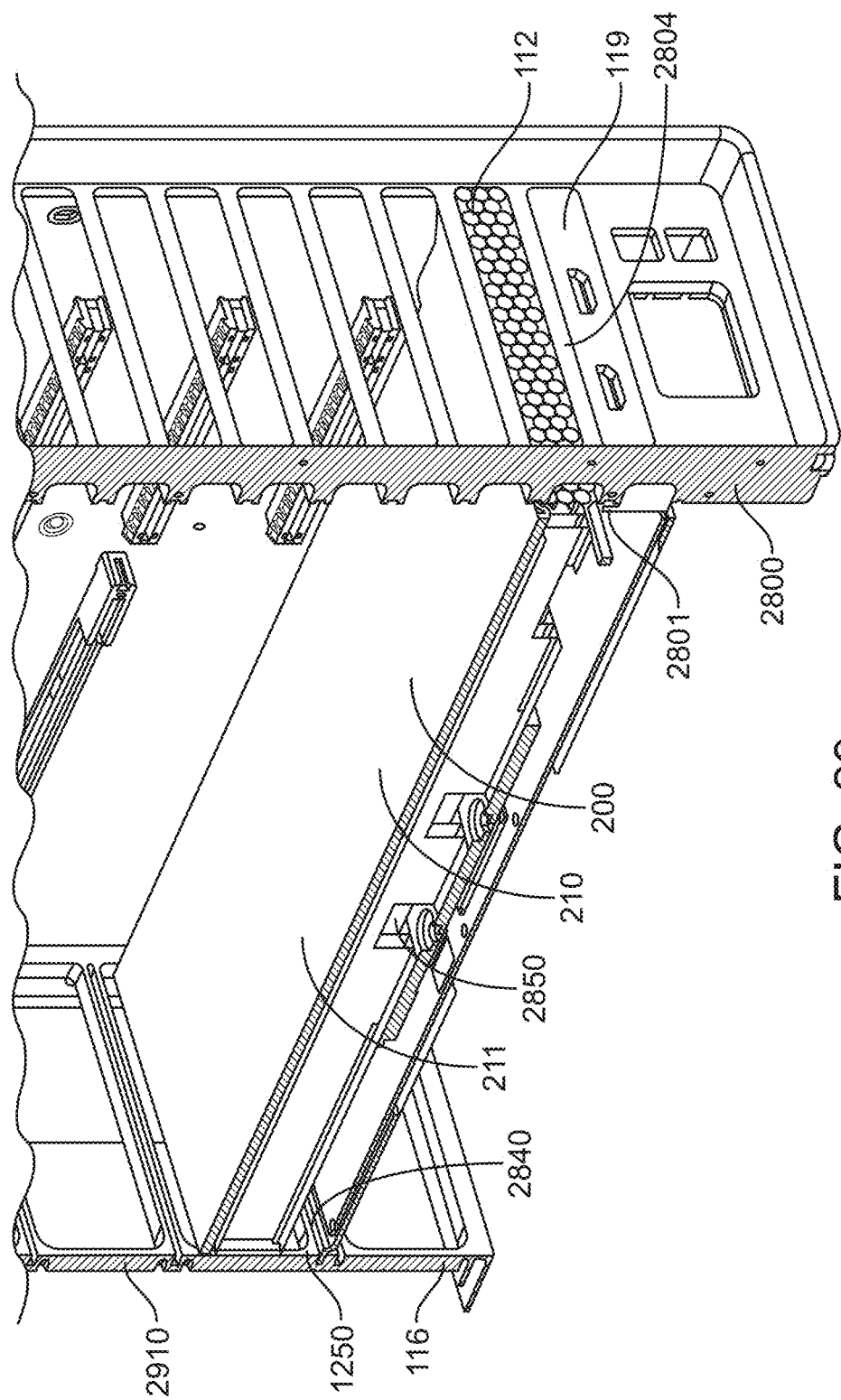
FIG. 29 illustrates a portion of a high-capacity computer module and a portion of a computer system according to an embodiment of the present invention.
Figure 31:
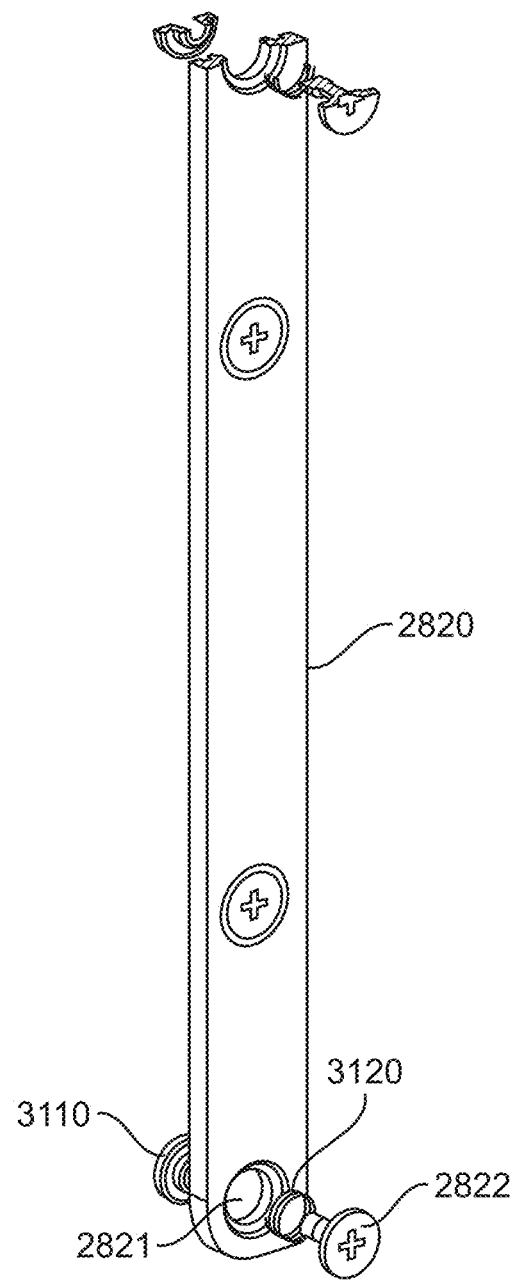

FIG. 29 illustrates a portion of a high-capacity computer module and a portion of a computer system according to an embodiment of the present invention. A rear portion of computer system enclosure 116 can include slots 2840 and rear surface 2910. Tab 1250 of high-capacity computer module 200 can be fit in a slot 2840. Cross beam 2804 of front grill 2800 can be fit in groove 119 of enclosure wall 112. Front grill 2800 can include opening 2801 for a fastener, as shown in FIG. 31.

These and other embodiments of the present invention can provide a robust high-capacity computer module 200 having excellent thermal management. For example, high-capacity computer module 200 can include a device enclosure 210 for mechanical support and strength. Heat sink 2850 can dissipate heat from various circuits 290 (shown in FIG. 18) to the device enclosure 210. Enclosure wall 112 can provide excellent ventilation for high-capacity computer module 200 by allowing airflow through it with only a minimal obstruction.

For example, computer module 200 can include board 220 (shown in FIG. 25) housed in enclosure 210. Enclosure 210 can include a back cover 213 (shown in FIG. 25), on top of which the board 220 can be fixed. Back cover 213 can extend around a side and partially over a top of the computer module. Enclosure 210 can further include heat sink 2850 that can be placed on, or form an inside surface of a top surface 211 of device enclosure 210. A set or stack of fins 1230 (shown in FIG. 17) and an enclosure wall 112 having a number of holes or perforations 113 can form sides of the computer module. The fins 1230 can have openings between them. The openings between fins 1230 and perforations 113 in the enclosure wall 112 can form ducting for air flow through computer module 200. Fins 1230, heat sink 2850, and top surface 211 of enclosure 210 can form structural support for computer module 200. Fins 1230, heat sink 2850, and top surface 211 of enclosure 210 can form fin cover 2860, as shown in FIG. 28. Fins 1230, heat sink 2850, back cover 213, and top surface 211 of enclosure 210 can interlock to provide a physically robust structure and improved heat dissipation for computer module 200. Other components, such as fastener 1823 (shown in FIG. 19) can provide further structural support.

Figure 30:
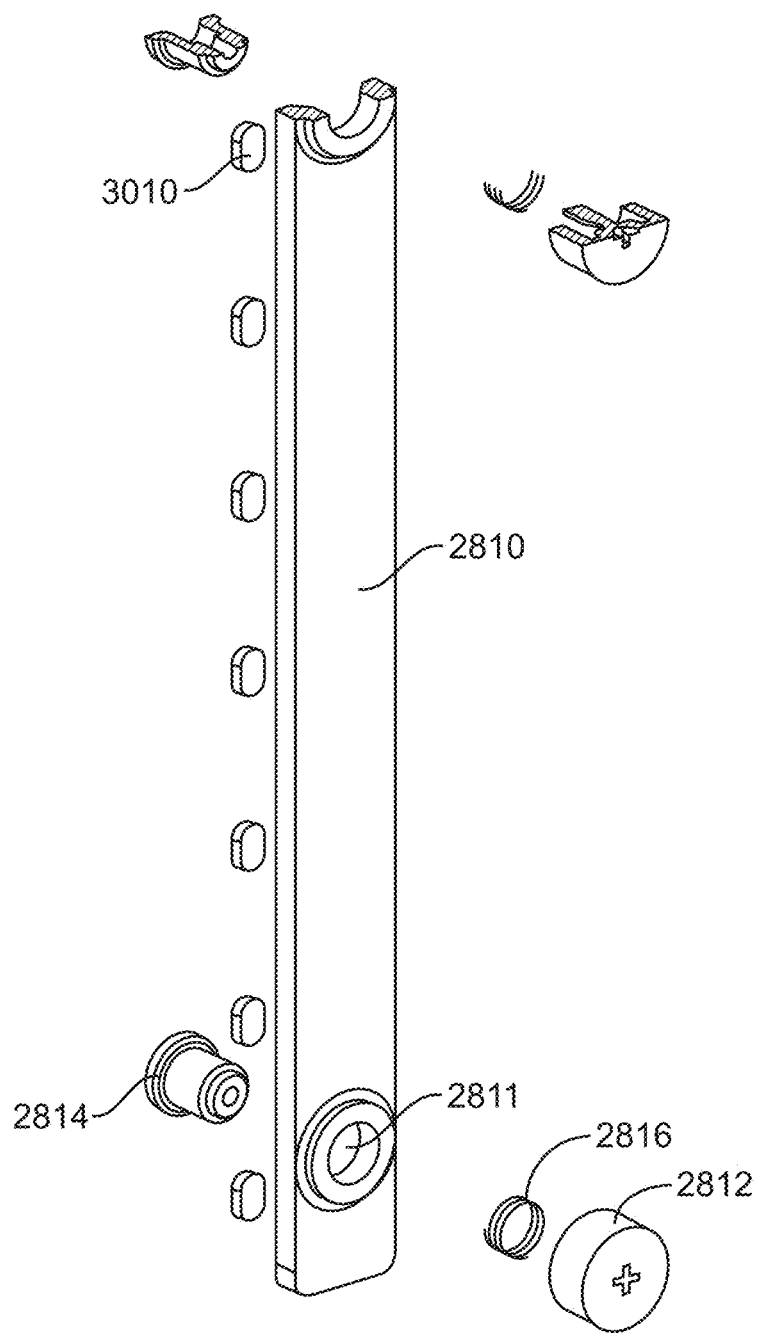
FIG. 30 is an exploded view of a front clamping portion of a computer system enclosure according to an embodiment of the present invention and FIG. 31 is an exploded view of a rear clamping portion of a computer system enclosure according to an embodiment of the present invention.

FIG. 30 is an exploded view of a front clamping portion of a computer system enclosure according to an embodiment of the present invention. Plate 2810 can be joined to front grill 2800 (shown in FIG. 28) to help secure high-capacity computer module 200 (shown in FIG. 28) in place. During insertion of computer module 200, extended surface 2510

(shown in FIG. 25) of enclosure wall 112 can be placed against a side of front grill 2800. Plate 2810 can be placed against extended surface 2510. Plate 2810, extended surface 2510, and front grill 2800 can be secured with fastener 2814, which can pass through opening 2811 in plate 2810, hole 2512 in extended surface 2510, and opening 2801 (shown in FIG. 29) of front grill 2800, using thumbscrew 2812. These fasteners can be held in place with washers 2816. Pads 3010 can be placed between plate 2810 and extended surface 2510, between extended surface 2510 and front grill 2800, or both or elsewhere, to reduce mechanical vibrations.

FIG. 31 is an exploded view of a rear clamping portion of a computer system enclosure according to an embodiment of the present invention. Plate 2820 can be joined to a rear portion of computing system enclosure 116 (shown in FIG. 28) to help secure high-capacity computer module 200 (shown in FIG. 28) in place. During insertion of computer module 200, tab 1210 of device enclosure 210 (shown in FIG. 25) can be placed against a rear surface 2910 (shown in FIG. 29) of computing system enclosure 116 (shown in FIG. 29.) Plate 2820 can be aligned with rear surface 2910 such that tab 1210 is between rear surface 2910 and plate 2820. In this way, plate 2820 and rear surface 2910 can form slots 2830 (shown in FIG. 28.) Clamp screw 2822 can be joined to fastener 3110 through opening 2821 in plate 2820, opening 1211 (shown in FIG. 25) in tab 1210 (shown in FIG. 25), and a corresponding opening (not shown) in rear surface 2910. Clamp screw 2822 and fastener 3110 can be secured using washer 3120.

These modules can be housed in enclosures that can be formed in various ways in these and other embodiments of the present invention. For example, they can be formed by machining, such as by using computer numerical controlled machines, stamping, forging, metal-injection molding, micro-machining, 3-D printing, or other manufacturing process. These enclosures can be formed of various materials. For example, they can be formed of aluminum, steel, stainless steel, copper, bronze, or other material. In these and other embodiments of the present invention, a material that provides good electrical shielding and thermal conductivity can be chosen.

Embodiments of the present invention can provide high-capacity modules that can be located in various types of devices, such as portable computing devices, tablet computers, desktop computers, laptops, all-in-one computers, wearable computing devices, smart phones, storage devices, portable media players, navigation systems, monitors, power supplies, video delivery systems, adapters, remote control devices, chargers, and other devices.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. A computer comprising:
    a computer system comprising:
        a main-logic board;
        a first socket on the main-logic board; and
        a second socket on the main-logic board;
    a first computer module comprising:
        a first board comprising:
            a first card edge extending from a first side of the first board and located in the first socket, wherein the first card edge has a first shape and a first plurality of contacts having a first pinout, and wherein a position of the first card edge on the first side, and the first shape and first pinout of the first card edge, are compliant with a Peripheral Component Interconnect (PCI) standard;
            a second card edge extending from the first side and located in the second socket and having a second shape and a second plurality of contacts having a second pinout, wherein the second shape and second pinout are not compliant with a PCI standard; and
            a plurality of circuits.

2. The computer of claim 1 wherein the first card edge is compliant with a Peripheral Component Interconnect Express (PCIe) standard.

3. The computer of claim 1 wherein the first card edge is compliant with a Peripheral Component Interconnect eXtended (PCI-X) standard.

4. The computer of claim 1 wherein the computer system further comprises:
    a third socket on the main-logic board; and
    a plurality of multiplexers coupled between contacts of the third socket and contacts of the second socket.

5. The computer of claim 4 wherein the multiplexers comprise analog multiplexers.

6. The computer of claim 1 wherein some of the second plurality of contacts on the second card edge are configured to convey DisplayPort data signals.

7. The computer of claim 1 wherein the first computer module further comprises
    a heat sink.

8. The computer of claim 1 wherein the plurality of circuits comprise a plurality of hard-disk drives.

9. The computer of claim 1 wherein the plurality of circuits comprise a plurality of solid-state drives.

10. The computer of claim 1, wherein the first computer module further comprises:
    an enclosure; and
    an ejection mechanism to eject the first card edge from the first socket and the second card edge from the second socket, the ejection mechanism comprising:
        a first sliding member; and
        a lever located in an opening in the enclosure, the lever arranged to rotate about a first axis and attached to the first sliding member, wherein when the first card edge is inserted in the first socket and the second card edge is inserted in the second socket and the lever is rotated in a first direction about the first axis, the first sliding member extends from the enclosure and provides a force to eject the first card edge from the first socket and the second card edge from the second socket.

11. The computer of claim 10 further comprising a first magnet attached to the enclosure, wherein the lever comprises a second magnet, a third magnet, and a fourth magnet, and wherein as the lever rotates in the first direction, the second magnet, the third magnet, and the fourth magnet sequentially align with the first magnet.

12. The computer of claim 11 wherein when the first and second magnets attract when they are aligned, the first and third magnets repel when they are aligned, and first and fourth magnets attract when they are aligned.

13. The computer of claim 12 wherein when the first and second magnets are aligned, the lever is flush with the enclosure of the first computer module.

14. The computer of claim 13 wherein when the first and fourth magnets are aligned, an end of the lever is spaced away from the enclosure of the first computer module.

15. The computer of claim 10 further comprising a second sliding member, wherein when the lever is rotated in the first direction about the first axis, the second sliding member extends from the enclosure and provides a force to eject the first card edge from the first socket and the second card edge from the second socket, and wherein the first sliding member and the second sliding member comprise wheels.

16. The computer of claim 1, wherein the computer system further comprises:

a third socket on the main-logic board, the third socket arranged parallel to the first socket;

a system controller; and a first fan coupled to the system controller; and wherein the first computer module further comprises comprising:

an enclosure the first board housed in the enclosure, wherein the first computer module communicates a first parameter to the system controller using the first socket, and at least partially in response to the first parameter, the system controller sets a speed of the first fan.

17. The computer of claim 16 wherein the first parameter is one of a temperature of the first computer module or a power consumption of the first computer module.

18. The computer of claim 16 further comprising:

a latching mechanism on the main-logic board, the latching mechanism comprising:

a hook rail comprising a plurality of hooks and capable of being moved by a user between a first position and a second position, wherein when the hook rail is in the first position, a hook in the plurality of hooks secures the first board of the first computer module in place in the first socket and the second socket, and wherein the hook rail is in the second position, the hook in the plurality of hooks releases the first board of the first computer module such that the first computer module is removable.

19. The computer of claim 16 wherein the computer system further comprises a second fan, and wherein when the third socket is occupied by a second computer module, a speed of the second fan is determined at least in part by the first parameter provided to the system controller by the first computer module and a second parameter provided to the system controller by the second computer module, and when the third socket is unoccupied, a speed of the second fan is determined at least in part by the first parameter provided to the system controller by the first computer module and an absence of a computer module in the third socket.

20. The computer of claim 16 wherein the first computer module comprises a plurality of fins at a first end, the first end at least approximately aligned with the first fan, wherein the plurality of fins guides air flow provided by the first fan through the first computer module.

* * * * *